United States Patent
Fuchs et al.

(10) Patent No.: US 12,374,860 B2
(45) Date of Patent: Jul. 29, 2025

(54) SEMICONDUCTOR LASER AND LIDAR SYSTEM AND ALSO LASER SYSTEM WITH THE SEMICONDUCTOR LASER

(71) Applicant: ams-OSRAM International GmbH, Regensburg (DE)

(72) Inventors: Peter Fuchs, Regensburg (DE); Bruno Jentzsch, Regensburg (DE); Hubert Halbritter, Dietfurt-Toeging (DE); Martin Rudolf Behringer, Regensburg (DE); Alvaro Gomez-Iglesias, Regensburg (DE); Christian Lauer, Pettendorf (DE); Dean Maximilian Schoke, Regensburg (DE); Tomasz Swietlik, Burgweinting (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 431 days.

(21) Appl. No.: 17/919,843

(22) PCT Filed: Apr. 21, 2021

(86) PCT No.: PCT/EP2021/060440
§ 371 (c)(1),
(2) Date: Oct. 19, 2022

(87) PCT Pub. No.: WO2021/214174
PCT Pub. Date: Oct. 28, 2021

(65) Prior Publication Data
US 2023/0208110 A1    Jun. 29, 2023

(30) Foreign Application Priority Data
Apr. 24, 2020   (DE) ................. 10 2020 205 254.9

(51) Int. Cl.
*H01S 5/00*   (2006.01)
*H01S 5/028*   (2006.01)
(Continued)

(52) U.S. Cl.
CPC .......... *H01S 5/0287* (2013.01); *H01S 5/3095* (2013.01); *H01S 5/4043* (2013.01);
(Continued)

(58) Field of Classification Search
CPC .... H01S 5/0287; H01S 5/3095; H01S 5/4043; H01S 5/0281; H01S 5/0284; H01S 5/1096; H01S 5/18
See application file for complete search history.

(56) References Cited

U.S. PATENT DOCUMENTS

| | | | |
|---|---|---|---|
| 4,839,901 A | * 6/1989 | Mozer | ............ H01S 5/028 372/49.01 |
| 5,224,113 A | 6/1993 | Tsang | |

(Continued)

FOREIGN PATENT DOCUMENTS

| | | |
|---|---|---|
| CN | 1661871 A | 8/2005 |
| CN | 110731036 A | 1/2020 |

(Continued)

OTHER PUBLICATIONS

Hervé, Denis, International Search Report (with English Translation) and Written Opinion in corresponding International Application No. PCT/EP2021/060440 mailed on Jul. 30, 2021, 15 pages.

(Continued)

*Primary Examiner* — Kinam Park
(74) *Attorney, Agent, or Firm* — MH2 Technology Law Group LLP

(57) ABSTRACT

According to embodiments, a semiconductor laser comprises a semiconductor layer stack, which comprises an active zone for generating radiation. The semiconductor (Continued)

laser also comprises a first resonator mirror, a second resonator mirror, and an optical resonator, which is arranged between the first and second resonator mirrors and extends in a direction parallel to a main surface of the semiconductor layer stack. A reflectance R1 of the first resonator mirror is wavelength-dependent, so that R1 or a product R of R1 and the reflectance R2 of the second resonator mirror in a wavelength range decreases from a target wavelength $\lambda_0$ of the laser to $\lambda_0+\Delta\lambda$ from a value R0, wherein $\Delta\lambda$ is selected as a function of a temperature-dependent shift in an emission wavelength.

20 Claims, 22 Drawing Sheets

(51) Int. Cl.
*H01S 5/30* (2006.01)
*H01S 5/40* (2006.01)
*G01S 17/88* (2006.01)
*H01S 5/10* (2021.01)
*H01S 5/18* (2021.01)

(52) U.S. Cl.
CPC ............ *G01S 17/88* (2013.01); *H01S 5/0281* (2013.01); *H01S 5/0284* (2013.01); *H01S 5/1096* (2013.01); *H01S 5/18* (2013.01)

(56) References Cited

U.S. PATENT DOCUMENTS

| | | | |
|---|---|---|---|
| 6,556,607 B1 | 4/2003 | Jewell | |
| 6,819,702 B2 * | 11/2004 | Sverdlov | H01S 5/028 372/102 |
| 10,897,119 B1 * | 1/2021 | Kurczveil | G01J 5/00 |
| 2004/0037342 A1 * | 2/2004 | Blauvelt | H01S 5/12 372/102 |
| 2004/0047390 A1 * | 3/2004 | Sverdlov | H01S 5/028 372/102 |
| 2005/0085603 A1 | 4/2005 | Kristen et al. | |
| 2005/0190807 A1 | 9/2005 | Toyama | |
| 2008/0240198 A1 * | 10/2008 | Yagi | B82Y 20/00 372/92 |
| 2009/0097519 A1 | 4/2009 | Brick et al. | |
| 2010/0277714 A1 | 11/2010 | Pedersen et al. | |
| 2011/0051772 A1 * | 3/2011 | Fukuda | B82Y 20/00 372/50.1 |
| 2020/0203921 A1 | 6/2020 | Fuchs | |

FOREIGN PATENT DOCUMENTS

| | | |
|---|---|---|
| DE | 10323860 A1 | 11/2004 |
| JP | 2004002306 A | 1/2004 |
| JP | 2005272632 A | 10/2005 |
| JP | 2009129979 A | 6/2009 |
| JP | 2010242506 A | 10/2010 |
| JP | 2011503526 A | 1/2011 |
| WO | 2010147035 A1 | 12/2010 |

OTHER PUBLICATIONS

Japanese Office Action dated Oct. 26, 2023 issued in corresponding Japanese patent application No. 2022-564266, 4 pages.
Chinese Office Action issued in corresponding Chinese Application No. 202180029344.3 dated Mar. 28, 2025, with English language translation, 13 pages.

* cited by examiner

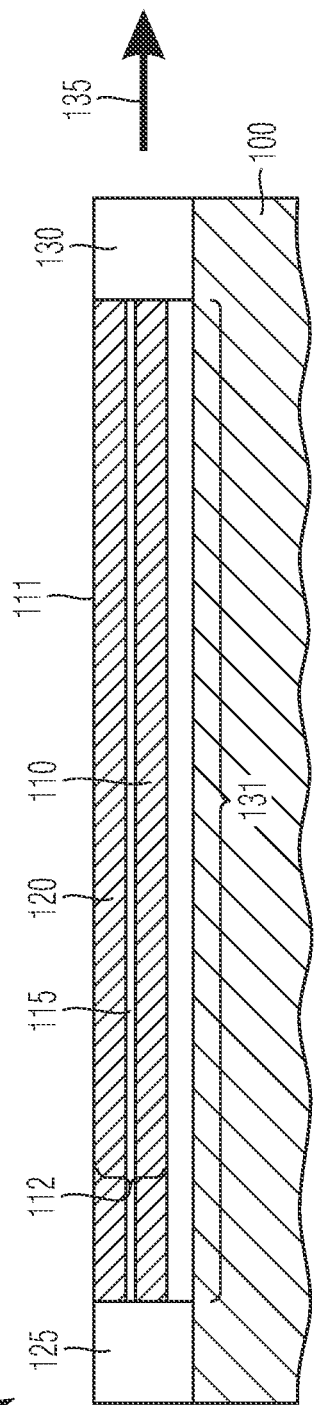
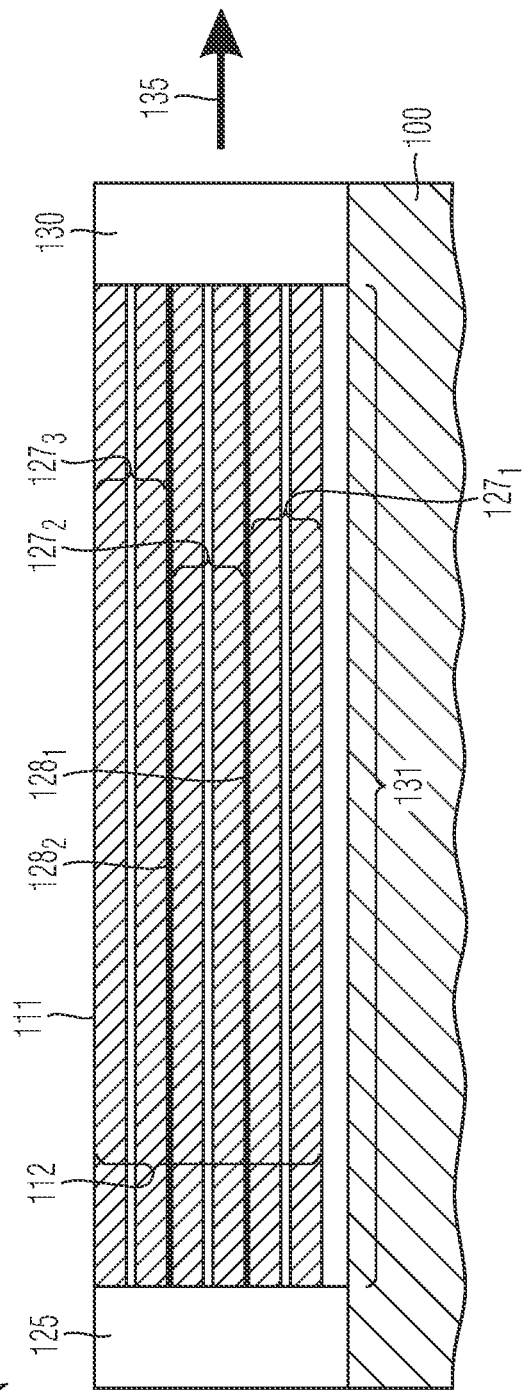

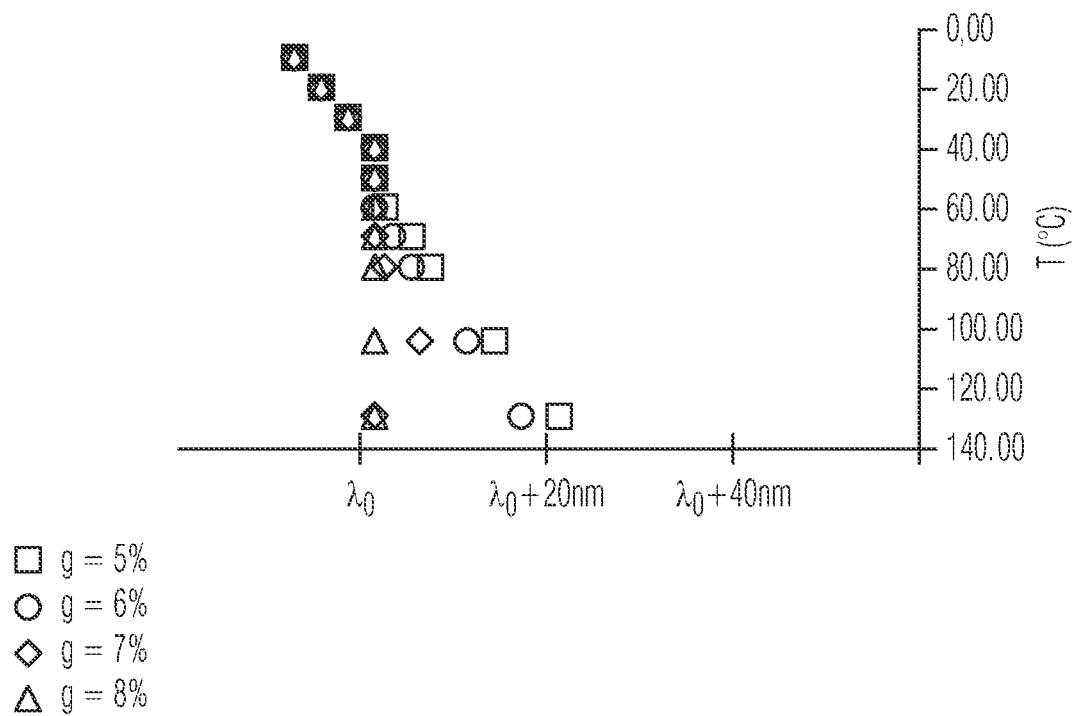

SEMICONDUCTOR LASER AND LIDAR SYSTEM AND ALSO LASER SYSTEM WITH THE SEMICONDUCTOR LASER

CROSS-REFERENCE TO RELATED APPLICATIONS

This patent application is a national stage entry from International Application No. PCT/EP2021/060440, filed on Apr. 21, 2021, published as International Publication No. WO 2021/214147 A1 on Oct. 28, 2021, and claims priority to German patent application DE 10 2020 205 254.9, filed Apr. 24, 2020, the disclosure contents of all of which are incorporated herein by reference.

BACKGROUND OF THE INVENTION

LIDAR systems are increasingly being used in vehicles, for example for autonomous driving. For example, they are used to measure distances or to detect objects. In LIDAR systems, a narrow window for the wavelength used is usually very favorable, because in this case the sunlight may be effectively suppressed as an interference signal using a narrow-band filter. Since the emission wavelength changes by more than 0.2 nm/K in conventional edge-emitting semiconductor lasers, concepts are being investigated in which the wavelength hardly changes even at variable temperatures, i.e., in which increased temperature stability is ensured.

It is an object of the present invention is to provide an improved semiconductor laser and an improved LIDAR system.

SUMMARY OF THE INVENTION

According to embodiments, the object is achieved by the subject matter of the independent claims. Advantageous developments are defined in the dependent claims.

According to embodiments, a semiconductor laser comprises a semiconductor layer stack comprising an active zone for generating radiation. The semiconductor laser further comprises a first resonator mirror, a second resonator mirror, and an optical resonator arranged between the first and second resonator mirrors which extends in a direction parallel to a main surface of the semiconductor layer stack. A reflectance R1 of the first resonator mirror is wavelength-dependent, so that R1 or a product R of R1 and the reflectance R2 of the second resonator mirror decreases in a wavelength range from a target wavelength $\lambda_0$ of the laser to $\lambda_0 + \Delta\lambda$ from a value R0, where $\Delta\lambda$ is selected as a function of a temperature-dependent shift in an emission wavelength. At least one of the following relationships applies to R:

$R(\lambda) < 0.3 * R0$ for at least one wavelength $\lambda$ with $\lambda_0 < \lambda < \lambda_0 + \Delta\lambda$; (i)

$dR/d\lambda < k/nm$ for $\lambda = \lambda_0$ with $k \leq -0.1\%$. (ii)

Alternatively or simultaneously, at least one of the following relationships applies to R1:

$R1(\lambda) < 0.3 * R0$ for at least one wavelength $\lambda$ with $\lambda_0 < \lambda < \lambda_0 + \Delta\lambda$; (iii)

$dR1/d\lambda < k/nm$ for $\lambda = \lambda_0$ with $k \leq -0.1\%$. (iv)

According to further embodiments, k may also be less than or equal to −0.2% or less than or equal to −0.5%.

For example, $\Delta\lambda$ may be in a range greater than 5 nm. For example, $\Delta\lambda$ may be greater than 10 or greater than 30 nm. For example, $\Delta\lambda$ may be less than 100 nm, for example less than 80 nm.

For example, R or R1 may increase to the value R0 at a wavelength less than $\lambda_0$.

According to further embodiments, the second resonator mirror may also have a wavelength-dependent reflectance which increases to a local maximum value for wavelengths less than $\lambda_0$.

According to embodiments, in the semiconductor laser, a sum of intrinsic losses of the semiconductor laser and mirror losses caused by the first and second resonator mirrors may increase for wavelengths $\lambda$ in a range of $\lambda_0 < \lambda < X_0 + \Delta\lambda$.

For example, the sum of the intrinsic losses of the semiconductor laser and the mirror losses may rise at least half as steeply as a curve that corresponds to the product of the confinement factor $\Gamma(\lambda,T)$ and the wavelength-dependent gain $g(\lambda,T)$.

According to further embodiments, the sum of the intrinsic losses of the semiconductor laser and the mirror losses may rise more steeply than a curve that corresponds to the product of the confinement factor $\Gamma(\lambda,T)$ and the wavelength-dependent gain $g(\lambda,T)$.

According to further embodiments, at least one of the following relationships may apply:

$dR/d\lambda < -g*R(\lambda)/nm$ for $\lambda_0 < \lambda < \lambda_0 + \Delta\lambda$; (v)

$dR1/d\lambda < -g*R1(\lambda)/nm$ for $\lambda_0 < \lambda < \lambda_0 + \Delta\lambda$; (vi)

with $g \geq 0.03$.

For example, the first resonator mirror may be implemented as a Bragg mirror. For example, the individual layers of the Bragg mirror may contain AlO, TaO, SiO, TiO, AlN, SiN, Si, NbO, ITO, ZnO, Ag and Al as well as InAlGaAsP, InAlGaN, ZnSe as semiconductor materials. The sequence, composition and layer thickness of the respective layers are selected such that a desired reflectance is achieved.

The Bragg mirror may, for example, comprise epitaxially grown semiconductor layers.

According to embodiments, at least one of the semiconductor layers of the Bragg mirror may be suitable for absorbent electromagnetic radiation having a wavelength range which is smaller than $\lambda_0$.

For example, the reflectance R1 of the first resonator mirror or the product R may be less than 8% in a range of the target wavelength.

According to embodiments, the active zone exclusively comprises a single quantum well structure.

According to further embodiments, the active zone comprises a multiple quantum well structure comprising quantum wells that are detuned to one another.

For example, a charge carrier density at the lasing threshold may increase by more than 25% in a temperature range from 0° to 60° C.

According to embodiments, the emission wavelength of the semiconductor laser decreases with temperature at an ambient temperature greater than 100° C. or even at a temperature greater than 60° C.

The semiconductor layer stack of the semiconductor laser may comprise a plurality of laser elements which are arranged one above the other and are connected to one another through connecting layers.

For example, lateral boundaries of the semiconductor layer stack are beveled, so that generated electromagnetic radiation is emitted through a first main surface of the semiconductor layer stack.

A LIDAR system comprises the semiconductor laser as described above.

Further embodiments relate to a laser system comprising the semiconductor laser as described above and a further laser, the further laser being optically pumpable by the semiconductor laser.

The accompanying drawings serve to provide an understanding of exemplary embodiments of the invention. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

BRIEF DESCRIPTION OF THE DRAWINGS

FIG. 1A illustrates elements of an edge-emitting semiconductor laser according to embodiments.

FIG. 1B illustrates components of an edge-emitting semiconductor laser according to further embodiments.

FIG. 3D shows the course of the emission wavelength as a function of temperature in semiconductor lasers according to embodiments.

DETAILED DESCRIPTION

Figure 1C:
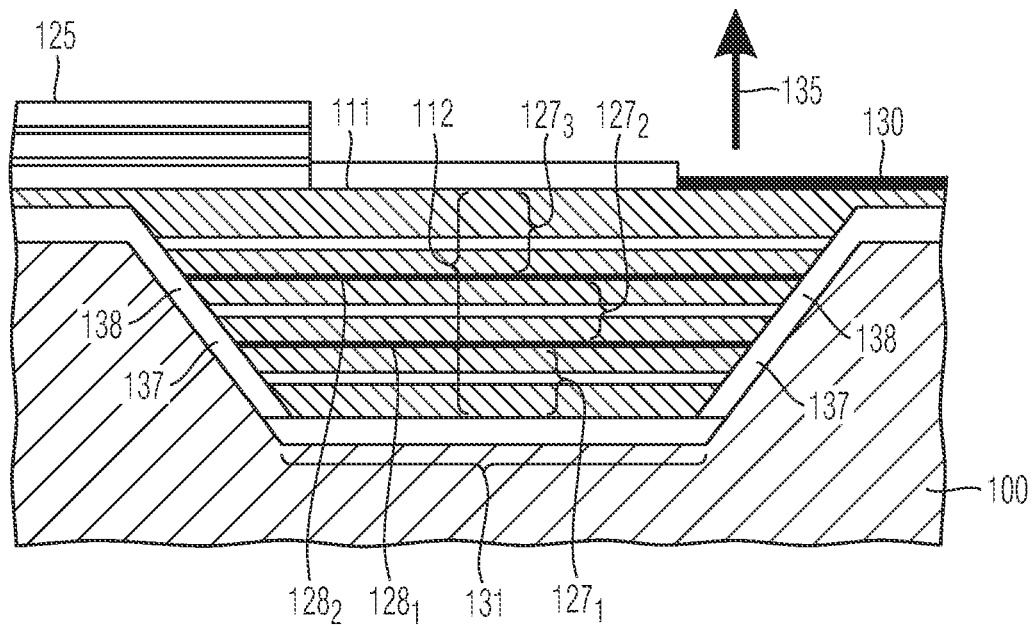
FIG. 1C illustrates the structure of a semiconductor laser in which emission occurs through a main surface, according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The lasers described herein are based on semiconductor materials. In general, the terms "wafer", "semiconductor" or "semiconductor material" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material, for example a GaAs substrate, a GaN substrate or an Si substrate, or of an insulating material, for example sapphire.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and further semiconductor materials such as GaAs, AlGaAs, InGaAs, AlInGaAs, AlGaAsP, InGaAsP, SiC, ZnSe, ZnO, $Ga_2O_3$, diamond, hexagonal BN, and combinations of the materials mentioned. The stoichiometric ratio of the compound semoconductor materials may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal" as used in the present description are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical" as used in this description is intended to describe an orientation which is essentially perpendicular to the first surface of the semiconductor substrate or semiconductor body. The vertical direction may correspond, for example, to a direction of growth when layers are grown.

FIG. 1A shows components of a semiconductor laser 10 according to embodiments. The semiconductor laser 10 comprises a semiconductor layer stack 112. The semiconductor layer stack 112 includes an active zone 115 for generating radiation. The semiconductor laser 10 also includes a first resonator mirror 125, a second resonator mirror 130, and a resonator 131 arranged between the first and second resonator mirrors 125, 130. The resonator 131 extends in a direction parallel to a main surface 111 of the semiconductor layer stack 112. As will be explained below, the first resonator mirror 125 has wavelength-dependent reflectance. The wavelength-dependent reflectance will be explained in more detail later. The second resonator mirror 130 may have lower reflectance than the first resonator mirror 125, for example. The second resonator mirror 130 may also have wavelength-dependent reflectance. The generated laser radiation 135 may be coupled out via the second resonator mirror 130. Alternatively, the first resonator mirror 125 may have lower reflectance than the second resonator mirror 130. For example, the generated laser radiation 135 may also be coupled out via the first resonator mirror 125.

The semiconductor layer stack 112 comprises a first semiconductor layer 110 of a first conductivity type, for example of the p-type, and a second semiconductor layer 120 of a second conductivity type, for example of the n-type. Further semiconductor layers may be arranged between the substrate 100 and the first semiconductor layer 110. For example, additional electrical contact elements may be provided in order to apply an electrical voltage to the semiconductor laser. Furthermore, additional semiconductor layers and/or insulating layers may be arranged over the second semiconductor layer 120.

The substrate 100 may be insulating or may include a semiconductor material. The semiconductor layers may be grown epitaxially over the substrate 100, for example. An active zone 115 may be arranged between the first and second semiconductor layers 110, 120. The active zone 115 may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures.

The active zone 115 is provided by a layer or layer sequence the main surface of which extends perpendicular to an extension direction of the optical resonator 131. Such a semiconductor laser is generally referred to as an edge-emitting semiconductor laser. However, as will be explained later with reference to FIGS. 5A to 7C, it is also possible with such a configuration to emit electromagnetic radiation via a main surface 111 of the semiconductor layer stack 112.

In the arrangement shown in FIG. 1B, three laser elements $127_1$, $127_2$, $127_3$ are arranged one above the other. Each of the individual laser elements includes a first semiconductor layer 110, a second semiconductor layer 120, and an active zone 115. Again, the first semiconductor layers may each be of the first conductivity type, and the second semiconductor layers 120 are each of the second conductivity type. The individual laser elements $127_1$, $127_2$, $127_3$ are connected to one another via connecting layers $128_1$, $128_2$, respectively. The connecting layers $128_1$, $128_2$ may each be tunnel junctions, so that an electrical connection is made possible. It goes without saying that more than 3 laser elements $127_1$, $127_2$, $127_3$ may be stacked.

Within the scope of the present application, the term "tunnel junction" generally encompasses a sequence of very highly doped semiconductor layers of a first and a second conductivity type. For example, a first highly doped layer of the first conductivity type may be arranged adjacent to and in contact with the first semiconductor layer 110 of the first conductivity type of the laser element $127_1$, $127_2$, $127_3$. Furthermore, a second heavily doped layer of the second conductivity type may be arranged adjacent to and in contact with the second semiconductor layer 120 of the second conductivity type of the laser element $127_1$, $127_2$, $127_3$. Optionally, additional intermediate layers may be arranged between the highly doped layers. The sequence of very highly doped layers of the first and second conductivity types and optionally the intermediate layer represent a tunnel diode. Using these tunnel diodes, the laser elements $127_1$, $127_2$, and $127_3$ may be respectively connected in series.

Like in FIG. 1A, a first resonator mirror 125 and a second resonator mirror 130 are provided in this case also. Similar to FIG. 1A, the first resonator mirror 125 has a specific wave-dependent reflectance. The generated electromagnetic radiation 135 may be coupled out via the second resonator mirror 130. According to further embodiments, the second resonator mirror 130 may have a greater reflectance than the first resonator mirror. For example, the generated electromagnetic radiation 135 may be coupled out via the first resonator mirror 125. According to further embodiments, the second resonator mirror 130 may have a specific wavelength-dependent reflectance in addition.

The concepts described within the scope of the present application may also be applied to semiconductor lasers in which at least part of the optical resonator 131 extends in a direction parallel to a main surface 111 of the semiconductor layer stack 112, but in which emission of the radiation 135 occurs through the first main surface 111 of the semiconductor layer stack 112.

FIG. 1C shows a surface-emitting semiconductor laser according to embodiments with an optical resonator 131 extending parallel to the main surface 111. As shown in FIG. 1C, the end faces of the semiconductor layer assembly 112 are etched at an angle of 45°. A dielectric layer 138 may be deposited adjacent to the bevel-etched side edges. According to further embodiments, a dielectric carrier substrate 100 may also be directly adjacent to the bevel-etched side edges. Due to the difference in refractive index between the semiconductor material of the semiconductor layer stack 112 and the dielectric layer 138, total reflection occurs on the side edges in each case. As a result, the beveled edges of the semiconductor layer stack 112 act as reflective side edges 137.

A first and a second resonator mirror 125, 130 are each arranged over the first main surface 111 of the semiconductor layer arrangement 112.

The generated laser light is reflected in each case by the first resonator mirror 125 and the second resonator mirror 130 into the semiconductor layer stack with the active zone 115. In FIG. 1C, a plurality of laser elements $127_1$, $127_2$, and $127_3$ is stacked one above the other and connected to one another through connecting layers $128_1$, $128_2$. The connecting layers may in turn be tunnel junctions. The carrier substrate 100 is patterned according to the shape of the semiconductor stack. The second resonator mirror 130 has, for example, lower reflectance than the first resonator mirror 125. Correspondingly, generated electromagnetic radiation 135 is coupled out via the first main surface 111 at the position of the second resonator mirror 130.

For example, the material of the first and second semiconductor layers 110, 120, and of the active zone may be based on the AlGaAs or GaAs material system and may contain AlGaAs or GaAs semiconductor layers. In this case, the connecting layers $128_1$, $128_2$ may include a tunnel junction containing heavily doped AlGaAs:Te/C. The tunnel junction may, for example, contain AlGaAs doped with tellurium or with carbon, or GaAs doped with tellurium or with carbon. The layer thickness of the tunnel junction may be smaller than $\lambda/2$, for example, with corresponding to the effective wavelength in the repective propagation medium.

Figure 1D:
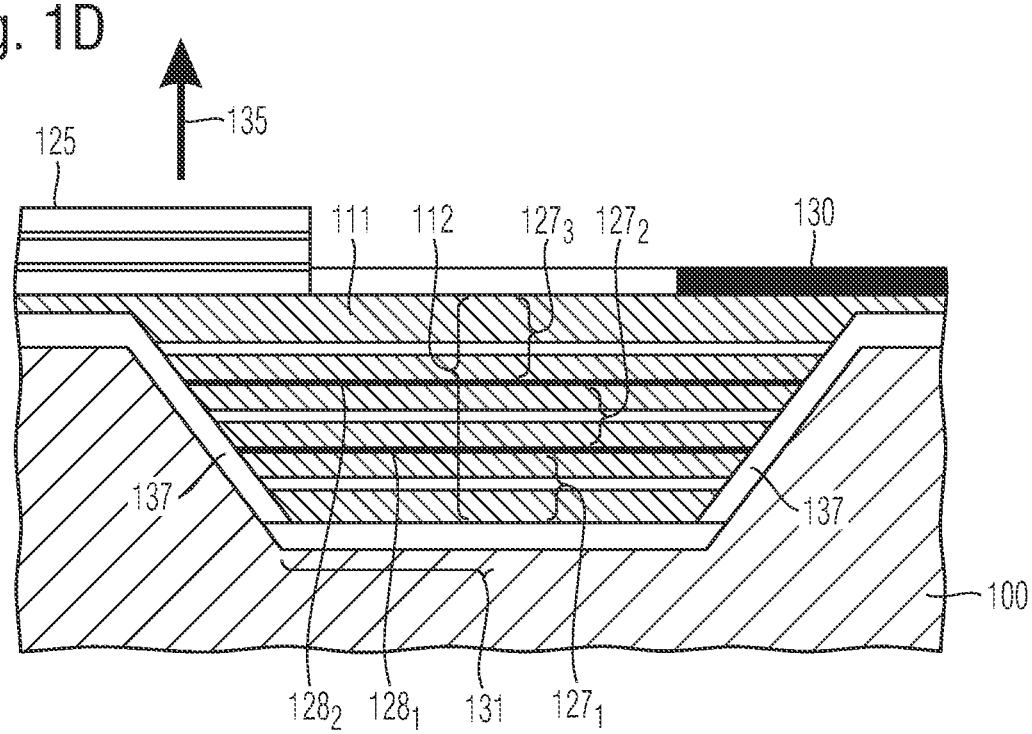
FIG. 1D illustrates the structure of a semiconductor laser in which emission occurs through a main surface according to further embodiments.

According to embodiments illustrated in FIG. 1D, the first resonator mirror 125 may have lower reflectance than the second resonator mirror 130. The generated electromagnetic radiation 135 may be emitted through the first main surface 111 at the position of the first resonator mirror 125. Other components of the semiconductor laser in FIG. 1D are similar or identical to those described with reference to FIG. 1C.

The semiconductor lasers described within the scope of the present disclosure may generally be based, for example, on the AlGaAs, the InAlGaAsP or the InAlGaN material system.

In semiconductor laser diodes, generally charge carrier pairs are injected into the active zone by the flow of electric current. As the current increases, the charge carrier density in the active zone and therefore, in turn, the maximum of the spectrum of optical amplification for the laser light circulating in the resonator of the laser diode increases also. The lasing threshold is reached when the modal optical gain at the maximum of the gain spectrum ($\Gamma^* g_{peak}$) compensates for the internal losses $\alpha_i$ and the mirror losses $\alpha_m$:

$$\Gamma^* g_{peak,th} = \alpha_i + \alpha_m.$$

The associated injection current is the threshold current. With currents above the lasing threshold and a constant temperature in the active zone, the charge carrier density there remains approximately constant because of strong stimulated recombination. However, the temperature of the laser diode increases as the ambient temperature rises and, due to the power dissipation of the laser, also as amperage increases. The optical gain usually decreases with temperature for a given carrier density, so that the lasing threshold (threshold current, threshold carrier density) increases as the temperature increases.

The increase in temperature and the increased carrier density usually result in a reduction of the band gap of semiconductors, due to increased interaction of the charge carriers and the changed lattice constant of the semiconductor crystal. As a result, the spectral position of the gain maximum and thus the emission wavelength shift to longer wavelengths.

The degree to which the emission wavelength shifts with temperature depends on the emission wavelength or photon energy. For example, the following relationships apply to the change in band gap or emission wavelength with temperature:

$$dE_g/dT = -0.4 \text{meV/K}. \text{This results in } E = hc/\lambda \text{ and}$$

$$d\lambda/dT = -\lambda^2/hc^* dE_g/dT.$$

The material system is selected according to the emission wavelength to be achieved. Accordingly, there is a connection between the shift in emission wavelength with temperature and the material system used. For emission wavelengths in a range from 900 to 1000 nm, this is approx. 0.25 to 0.32 nm/K. Usually the AlGaInAs material system is used for such emission wavelengths. For wavelengths around 400 nm, the level of emission wavelength shift is 0.05 nm/K. For such emission wavelengths, the InAlGaN material system is usually used. For wavelengths around 1250 nm, the level of emission wavelength shift is 0.5 nm/K. Usually the InAlGaAsP material system is used for this wavelength.

Figure 2A:
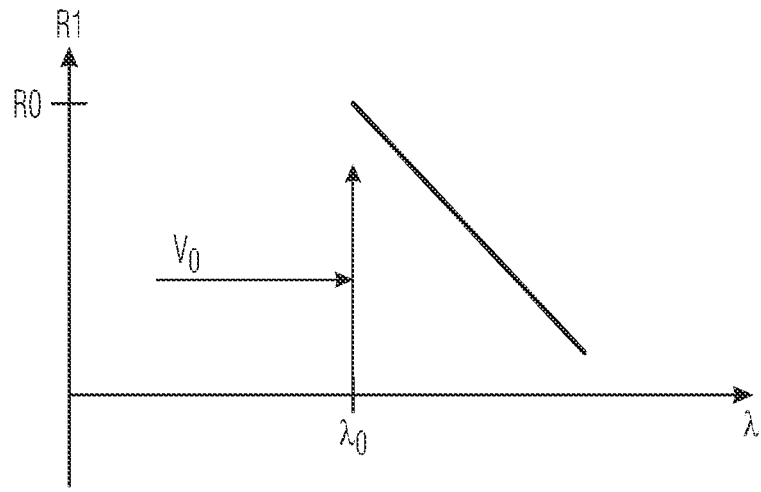
FIG. 2A illustrates a wavelength characteristic of a reflectance of a resonator mirror according to embodiments.

FIG. 2A schematically illustrates the wavelength-dependent reflectance R1 of the first resonator mirror 125. Like in FIG. 2A, the reflectance R1 falls from a value R0 in a wavelength range from a target wavelength $\lambda_0$ to $\lambda_0 + \Delta\lambda$. In this case, $\lambda_0$ designates the target wavelength of the semiconductor laser, and $\Delta\lambda$ is a measure of the variation in wavelength over an observed temperature fluctuation. If, for example, it is intended that the target wavelength of the semiconductor laser at the emission wavelength is at $T_1$, for example 20° C., and the semiconductor laser emits laser light of a constant wavelength in a temperature range from $T_1$ (20° C.) to $T_2$, for example 60° C., then $\lambda_0$ corresponds to the wavelength at $T_1$ (20° C.). $\Delta\lambda$ corresponds to the difference between the emission wavelength at $T_2$ (60° C.) and the emission wavelength at $T_1$ (20° C.). Furthermore, at least one of the two following relationships applies to the reflectance $R1(\lambda)$:

$$R1(\lambda) < 0.3 * R0 \text{ for } \lambda_0 < \lambda < \lambda_0 + \Delta\lambda; \quad \text{(iii)}$$

$$dR1/d\lambda < k/nm \text{ for } \lambda = \lambda_0 \text{ with } k \leq -0.1\%. \quad \text{(iv)}$$

According to further embodiments, k may be less than or equal to −0.2% or less than or equal to −0.5%.

In FIG. 2A, for example, the relationship (iv) is realized, i.e., the reflectance R1 falls steeply at $\lambda_0$.

For example, for wavelengths less than $\lambda_0$, the reflectance may be approximately constant within a range near $\lambda_0$. According to embodiments, the reflectance $R0=R1(\lambda_0)$ may represent a local maximum. According to further embodiments, $R0=R1(\lambda_0)$ may also represent a saddle point or may be any point of the course of the reflectance R1, for example lying in a downward slope of the reflectance R1.

Figure 2B:
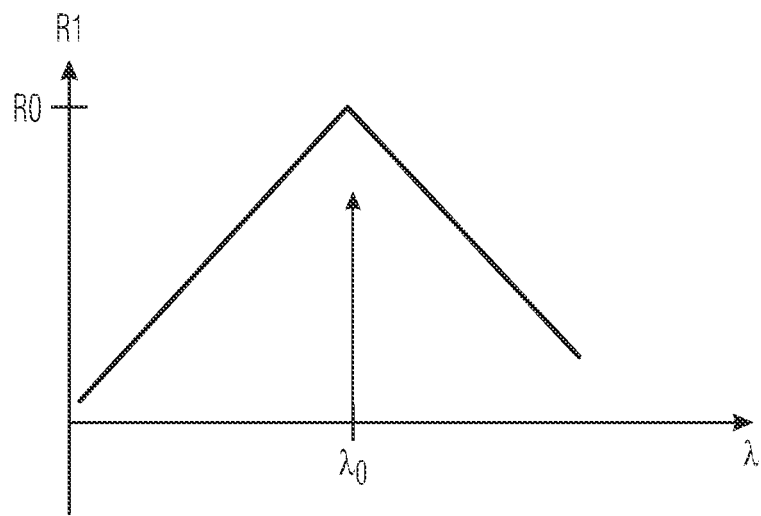
FIG. 2B illustrates the wavelength characteristic of the reflectance of a resonator mirror according to further embodiments.

According to embodiments, the first resonator mirror may also have the reflectance depicted in FIG. 2B. For example, the wavelength-dependent reflectance may first increase and then decrease again. More precisely, the wavelength-dependent reflectance—unlike in FIG. 2A—is not constant up to wavelength $\lambda_0$, but initially increases to a maximum value R0. The wavelength λ at which the reflectance R1 has a local maximum value corresponds to the target wavelength $\lambda_0$ of the laser. For a wavelength greater than $\lambda_0$, the reflectance of the resonator mirror falls from its local maximum value $R_{max}$.

As will be explained later in more detail, it is not necessary for the reflectance of the resonator mirror to decrease in a strictly monotonous manner. For example, the emission wavelength of a laser shifts with increasing temperature at a rate of 0.3 nm/K as a function of the emission wavelength. This is illustrated in FIG. 2A with the arrow labeled $v_0$. The target wavelength, i.e. the wavelength to be achieved by the laser, is designated as $\lambda_0$ in FIGS. 2A and 2B. Ideally, this corresponds to the wavelength at which the reflectance R1 shows a sharp bend. For example, R0 may be greater than 10%. For example, R0 may be greater than 30 or 40%.

Due to the fact that in the case of FIG. 2A, for example, the reflectance decreases at longer wavelengths, the corresponding mode is suppressed for electromagnetic radiation of longer wavelengths, so that the mode at $\lambda_0$ is amplified the most. In this way, temperature stability of the laser may be ensured.

In an analogous manner, according to FIG. 2B, the reflectance for wavelengths less than $\lambda_0$ increase with wavelength. In this configuration of the reflectance, too, the laser mode showing the maximum reflectance is particularly preferred, so that the emission wavelength is stabilized. Due of the special characteristics shown in FIG. 2B, the emission wavelength may be stabilized despite increasing temperature and temperature drift of the wavelength.

As shown in FIGS. 2A and 2B, the reflectance of the first mirror may fall linearly from its maximum value R0 with a certain steepness. According to further embodiments, the reflectance may also drop in a non-linear manner. This will be discussed in greater detail particularly in FIGS. 3C and 3D. In this way, a limitation of the reflectance is achieved, which increases the threshold for the generation of laser radiation at these wavelengths.

According to embodiments, the reflectance depicted in FIGS. 2A and 2B may be the reflectance of the first resonator mirror 125. FIG. According to further embodiments, the reflectance depicted in FIGS. 2A and 2B may be the combined reflectance and may be the product of the reflectance R1 of the first resonator mirror 125 and the reflectance R2 of the second resonator mirror 130.

Figure 3A:
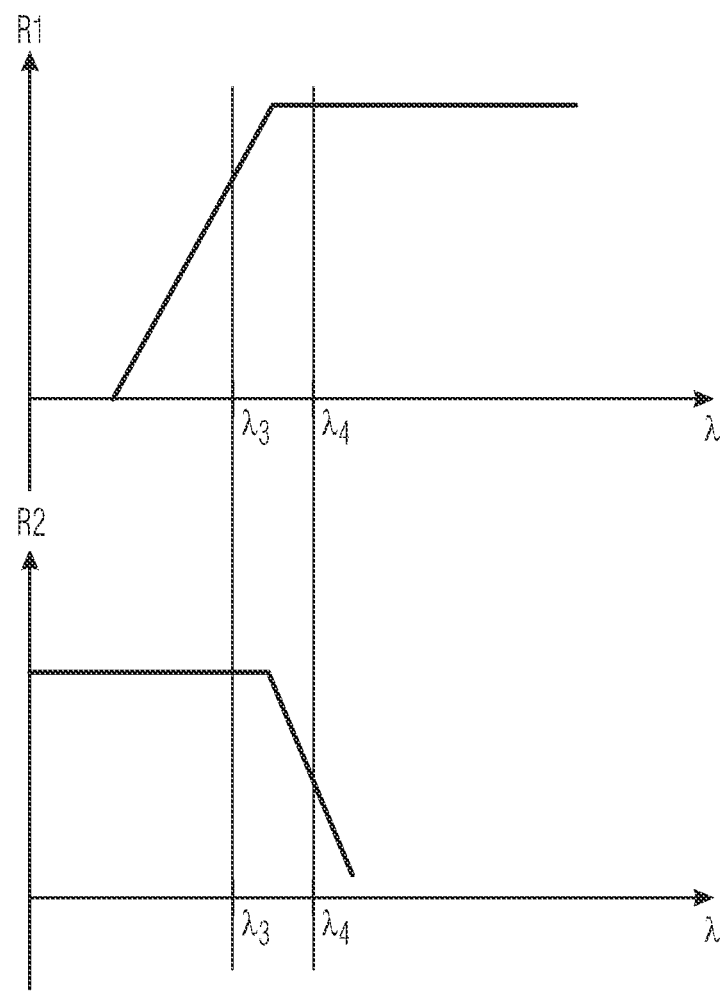
FIG. 3A illustrates combined reflection properties of resonator mirrors according to further embodiments.
Figure 3A:
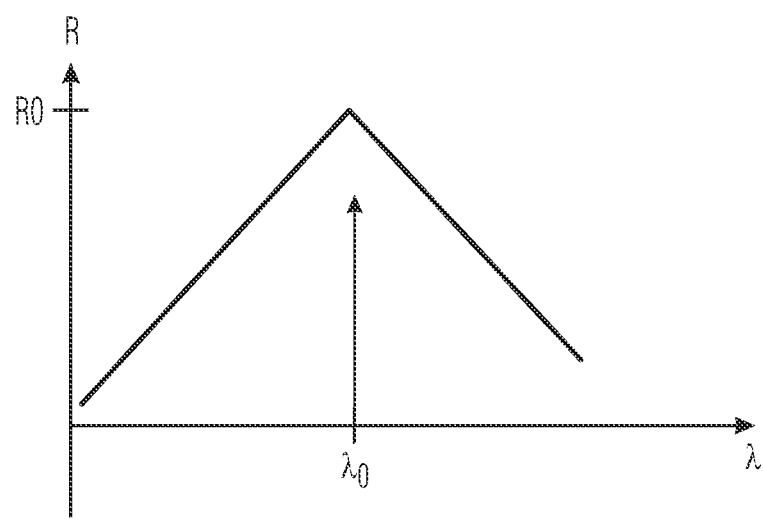

FIG. 3A illustrates further embodiments in which, for example, the first resonator mirror has an increasing reflectance R1 up to a first local maximum value and the second resonator mirror has an initially constant and later decreasing reflectance. The upper figure in the left part of FIG. 3A illustrates the course of the reflectance R1 of the first resonator mirror 125 as a function of the wavelength. The reflectance initially increases so that the maximum has not yet been reached at λ3. The maximum reflectance is reached at λ4. For wavelengths greater than λ4, the reflectance is constant.

The lower part of FIG. 3A shows the course of the reflectance R2 of the second resonator mirror as a function of the wavelength. In this case, the reflectance is initially constant and drops at a wavelength between λ3 and λ4. The reflectance is designed in such a way that, for both resonator mirrors, the ranges between λ3 and λ4, in which the first and the second reflectance each have a local maximum, overlap with each other.

As a result, the reflectance shown in the right part of FIG. 3A is achieved for the overall system. The reflectance R of the combination of the first and second resonator mirrors is such that the maximum reflectance R0 is present at the target wavelength $\lambda_0$. In a manner similar to that described with reference to FIG. 2B, the wavelength of the semiconductor laser is stabilized in this way. The reflectance R of the combination of the first and second resonator mirrors corresponds to the product of the reflectance $R_1$ of the first resonator mirror 125 and the second reflectance $R_2$ of the second resonator mirror 130. The first or the second resonator mirror 125, 130 may each be the outcoupling mirror.

Figure 3B:
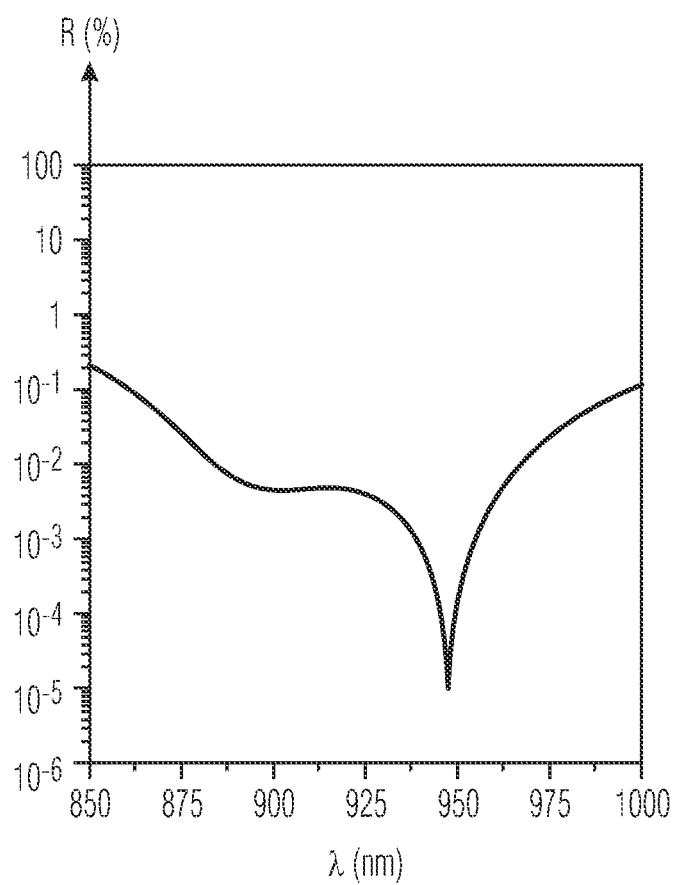
FIG. 3B illustrates reflection properties of a resonator mirror according to further embodiments.

FIG. 3B shows an example of a reflectance of a first resonator mirror 125 in a semiconductor laser 10 according to further embodiments. As may be seen, the reflectance drops sharply locally from a local maximum between 910 and 925 nm to a minimum between 940 and 950 nm. In this way, the emission wavelength of the semiconductor laser is stabilized in the range between 910 and 925 nm. The reflectance in the range under consideration is less than 1%. Accordingly, the first resonator mirror 125 represents the outcoupling mirror in this case. As may be further seen in FIG. 3B, the reflectance of the first resonator mirror is greater, for example, for 1000 nm or for 850 nm than in the wavelength range between 910 and 925 nm. However, since the maximum gain in the temperature range under consideration lies in the wavelength range between 900 and 950 nm, the greater reflectance outside of this wavelength range does not affect the emission wavelength of the semiconductor laser. The relationship between wavelength-dependent gain and reflectance will be described later in more detail.

Figure 3C:
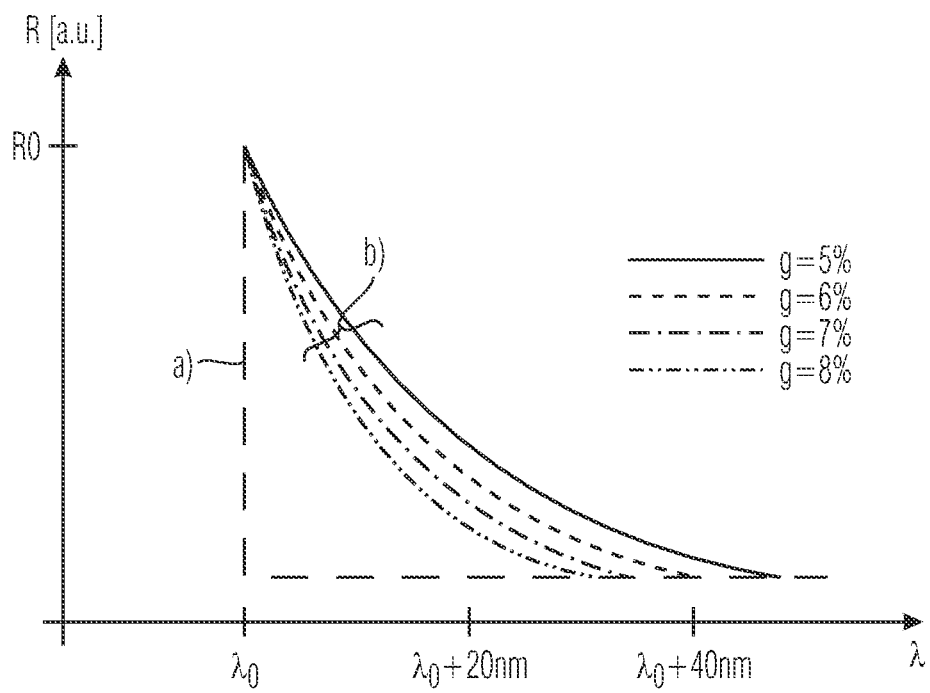
FIG. 3C illustrates reflection properties of a resonator mirror according to further embodiments.

FIG. 3C illustrates reflection properties of resonator mirrors according to further embodiments. The reflection properties shown may be the reflectance of the first resonator mirror or else the combined reflectance of both resonator mirrors within the resonator. For example, the reflectance may be the product of the reflectances of both resonator mirrors, i.e., $R=R_1$ or $R=R_1*R_2$. At the target wavelength, the derivative of the reflectance R with respect to wavelength is less than 0, i.e., the reflectance decreases, at least temporarily, for wavelengths greater than the target wavelength. In particular, the reflectance decreases in a range from the target wavelength $\lambda_0$ to a wavelength $\lambda_0+\Delta\lambda$. For example, $R(\lambda_0)>R(\lambda 0+\Delta\lambda)$. Δλ depends on the material system used. For example, for the GaAs material system, $\Delta\lambda$ may be 20 nm or 30 nm. As previously discussed, it is not required that the reflectance decrease strictly monotonically.

For example, the gradient of a tangent in the range of the target wavelength, i.e., $dR/d\lambda(\lambda_0)$ may be $<-0.03$/nm, so the slope may be greater than 3%. According to further embodiments, the following may apply:

$$dR/d\lambda(\lambda_0)<-0.05/nm \text{ or } dR/d\lambda(\lambda_0)<-0.07/nm.$$

The gradient may therefore be greater than 5% or even greater than 7%.

In addition, the reflectance curve may lie below one of the following two curves for R within a range from $\lambda_0$ to $\lambda_0+\Delta\lambda$.

$$R(\lambda)<0.3*R0 \text{ for } \lambda_0<\lambda<\lambda_0+\Delta\lambda; \quad \text{a)}$$

$$dR/d\lambda<-g*R(\lambda)/nm \text{ for } \lambda=\lambda_0 \quad \text{b)}$$

with $g\geq 0.03$, for example $g\geq 0.05$ or $g\geq 0.07$.

For example, in FIG. 3C, the combined reflectance $R=R_1*R_2$ or also $R=R_1$ may be considered, and R0 may be greater than 8%, for example greater than or equal to 10%.

In FIG. 3C these upper limits a), b) of the reflectance are shown as examples for courses of the wavelength-dependent reflectance for different values of g.

In general, a very strong slope at the target wavelength has a very positive effect on temperature stability. A course of the reflectance which is as close as possible to the jump or step function at the point $\lambda=\lambda_0$ leads to a high temperature stability of the emission wavelength. In this way, reflection and thus propagation of light of wavelengths greater than $\lambda_0$ is strongly suppressed. As a result, the wavelength may be stabilized in a particularly effective manner.

As indicated, the wavelength range considered around the target wavelength $\lambda_0+\Delta\lambda$ depends on the target wavelength. More precisely, for each material system, the wavelength shift of the amplification as a function of temperature may be taken as a basic material parameter in order to obtain the maximum wavelength shift of the emission wavelength for an assumed temperature difference, for example 80 K. $\Delta\lambda$ may then be determined from this.

For laser diodes that emit in the red to near infrared range, for example, a wavelength shift of about 0.3 nm/K is used as a basis for edge-emitting semiconductor lasers. Accordingly, a temperature change of 80 K leads to a wavelength shift of 24 nm, so that $\Delta\lambda$ is in the range of 20 to 30 nm. For example, these laser diodes may be based on the AlGaInAs material system.

For laser diodes that emit in the green or blue wavelength range, a wavelength shift of 0.05 nm/K is used as a basis for edge-emitting semiconductor lasers. Accordingly, a temperature change of 80 K leads to a wavelength shift of 4 nm. In this case, $\Delta\lambda$ may range from 5 to 10 nm. For example, these laser diodes may be based on the InGaN material system.

For laser diodes that emit in the near to mid-infrared range, for example up to about 1550 nm, a wavelength shift of 0.5 nm/K is used as a basis for edge-emitting semiconductor lasers. Accordingly, a temperature shift of 80 K leads to a wavelength shift of 40 nm. In this case, $\Delta\lambda$ may range from 40 to 50 nm. For example, these laser diodes may be based on the InP material system.

FIG. 3D shows the course of the emission wavelength as a function of temperature. As shown here, a particularly large value of g, i.e., a particularly strong slope at the $\lambda=\lambda_0$ point leads to a lower variation of the emission wavelength with temperature.

According to embodiments, the mirror having the wavelength-dependent reflectance may be realized by a Bragg mirror which includes a plurality of thin dielectric or semiconductor layers.

In general, the term "Bragg mirror" encompasses any arrangement that reflects incident electromagnetic radiation and includes dielectric or semiconductor layers. The Bragg mirror may be composed of dielectric or semiconductor layers. According to further embodiments, it may comprise additional metal layers. For example, the Bragg mirror may be formed by a sequence of very thin dielectric or semiconductor layers, each with different refractive indices. A mixture of dielectric and semiconductor layers is also possible. For example, the layers may alternately have a high refractive index (for example n>1.7) and a low refractive index (for example n<1.7). For example, the layer thickness of a layer pair may be $\lambda/4$, wherein $\lambda$ indicates the wavelength of the light to be reflected in the respective medium. The layer first seen from the point of view of the incident light may have a greater layer thickness, for example $3\lambda/4$. Due to the small layer thickness and the difference in the respective refractive indices, the Bragg mirror provides high wavelength-dependent reflectance. A Bragg mirror may comprise 2 to 50 dielectric or semiconductor layers, for example. A typical layer thickness of the individual layers may be about 30 to 90 nm, for example about 50 nm. The layer stack may further contain one or two or more layers that are thicker than about 180 nm, for example thicker than 200 nm.

According to further embodiments, the layers of the Bragg mirror may also be implemented by epitaxial semiconductor layers and using additional metal layers, if needed.

Materials of the resonator mirror having wavelength-dependent reflectance may contain, for example, AlO, TaO, SiO, TiO, AlN, SiN, Si, NbO, ITO, ZnO, Ag and Al, as well as InAlGaAsP, InAlGaN, ZnSe as semiconductor materials. The sequence, composition and layer thickness of the respective layers are selected in such a way that a desired reflectance is achieved.

According to embodiments, the second resonator mirror 130 may also be implemented as a Bragg mirror. The composition, sequence and layer thickness of the individual layers of the second resonator mirror may be selected in such a way that the second resonator mirror also has a wavelength-dependent reflectance. According to further embodiments, the composition, sequence and layer thickness of the individual layers of the second resonator mirror may be selected such that the second resonator mirror has no wavelength-dependent reflectance.

As has been described above, improved temperature stability of the emission wavelength may be achieved by a special configuration of the reflectance of the first and, if applicable, of the second resonator mirror. For example, it may be useful for the reflectance to drop steeply in a specific wavelength range.

Figure 4A:
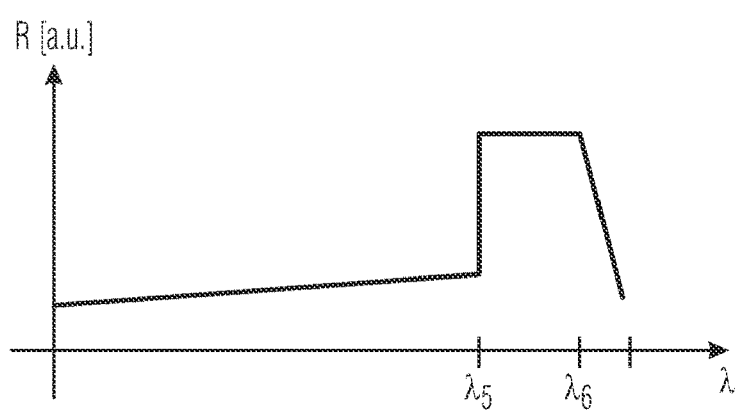
FIG. 4A illustrates reflection properties of a resonator mirror according to further embodiments.

FIG. 4A shows a schematic representation of the course of the combined reflectance R, which may correspond to the product of the reflectance of the first resonator mirror 125 and the second resonator mirror 130. Assuming that the reflectance of the second resonator mirror is essentially constant, the combined reflectance R may also correspond to the reflectance of the first resonator mirror. As may be seen, the reflectance increases sharply at wavelength $\lambda_5$ and falls sharply at wavelength $\lambda_6$. The strong decrease in reflectance at wavelength $\lambda_6$ may be caused, for example, by a corresponding configuration of the first resonator mirror as a Bragg mirror.

According to embodiments, the first resonator mirror 125 may be designed as a Bragg mirror and may comprise at least one epitaxially grown semiconductor layer.

This semiconductor layer may be suitable for absorbent electromagnetic radiation of a wavelength range that is less than the target wavelength $\lambda_0$ of the semiconductor laser. The semiconductor layer may thus be an absorbent layer 129. In this way, the steep slope of the reflectance may be realized on the side of smaller wavelengths.

Figure 4B:
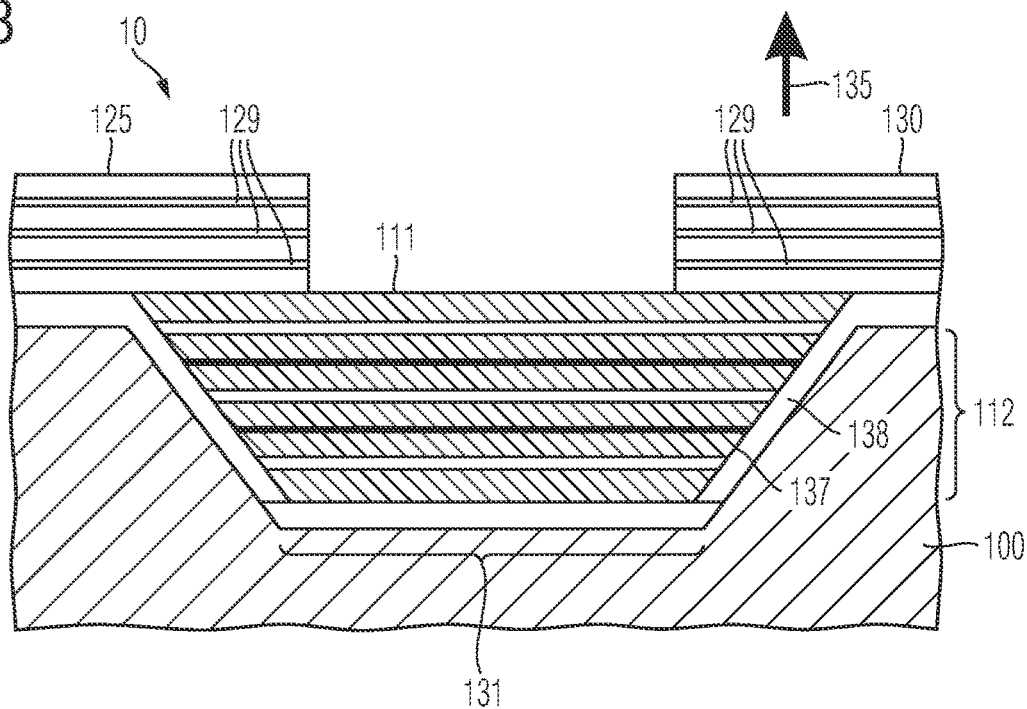
FIG. 4B shows a cross-sectional view of a semiconductor laser according to further embodiments.

FIG. 4B shows a schematic cross-sectional view of a semiconductor laser 10 comprising a horizontal resonator. In the case of the semiconductor laser 10, the generated electromagnetic radiation 135 is emitted through the first main surface 111 of the semiconductor layer stack. As may be seen, the first resonator mirror 125 is designed as a Bragg mirror, the Bragg mirror containing at least one absorbent layer 129 comprising one epitaxially grown semiconductor layer. The first resonator mirror 125 may contain a plurality of absorbent layers 129. These may contain the same or different semiconductor materials. The second resonator mirror 130 may be constructed in the same way or differently. The generated electromagnetic radiation 135 may be coupled out via the first or the second resonator mirror 125, 130.

Figure 4C:
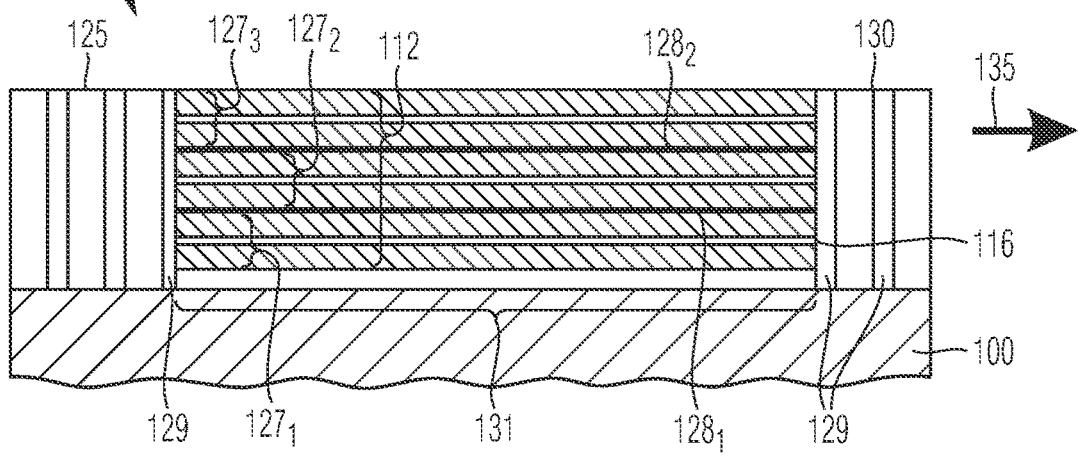
FIG. 4C shows a cross-sectional view of a semiconductor laser according to further embodiments.

FIG. 4C shows an example of a semiconductor laser 10 in which the generated electromagnetic radiation 135 is emitted through side faces 116 of the semiconductor layer stack 112. In this case, too, the first and, if applicabe, the second resonator mirror 125, 130 may be designed as a Bragg mirror. The first and, if applicable, the second resonator mirror 125, 130 may additionally contain an absorbent layer 129 which comprises an epitaxially grown semiconductor layer. The first resonator mirror 125 may contain a plurality of absorbent layers 129. These may each contain the same or different semiconductor materials. The second resonator mirror 130 may be constructed in the same way or differently. The generated electromagnetic radiation 135 may be coupled out via the first or the second resonator mirror 125, 130.

In the embodiments described, the semiconductor material of the absorbent layer 129 may comprise, for example, a III-V semiconductor material, for example of the AlGaInP or the AlInGaAs material system. By adjusting the composition ratio, the band gap and thus the absorbed wavelength range may be adjusted. According to further embodiments, the absorbent layer 129 may also contain GaSb. The absorbent layer may be designed as a quantum well layer, for example as a single or a multiple quantum well layer. According to further embodiments, the absorbent layer 129 may also contain bulk semiconductor material. For example, every second layer of the Bragg mirror may contain a semiconductor material and may be implemented as an absorbent layer 129. For example, that layer of the Bragg mirror which is arranged on the side of the semiconductor layer stack 112 may be an absorbent layer 129. According to the embodiments described, the semiconductor layer may be doped or undoped. According to embodiments, the Bragg mirror may contain both doped and undoped semiconductor layers. For example, the refractive index of the semiconductor layers may be changed further by doping the semiconductor layers, so that differences in the refractive indices of the semiconductor layers may be adjusted in accordance with the properties of the Bragg mirror to be achieved. According to embodiments, a layer thickness of the absorbent layer may correspond to approximately $\lambda_0/4$, wherein $\lambda_0$ may correspond to the target wavelength of the semiconductor laser. According to further embodiments, the layer thickness of the absorbent layer may be within a range from $(\lambda_0-\Delta\lambda)/4$ to $(\lambda_0+\Delta\lambda)/4$, wherein $\Delta\lambda$ may correspond to the change in the emission wavelength in the temperature range under consideration.

According to further embodiments, the first resonator mirror 125 may be designed as a Bragg mirror having the specific reflection behavior without an absorbent layer 129. Furthermore, the second resonator mirror 130 may be designed as a Bragg mirror and may include an absorbent layer 129. In this case, an effect may arise that the second resonator mirror 130 also shows wavelength-dependent reflectance. Due to the presence of the absorbent layer 129, however, that part of the radiation that is not reflected is absorbed by the second resonator mirror 130 and not, for example, within the housing of the semiconductor laser.

Figure 5A:
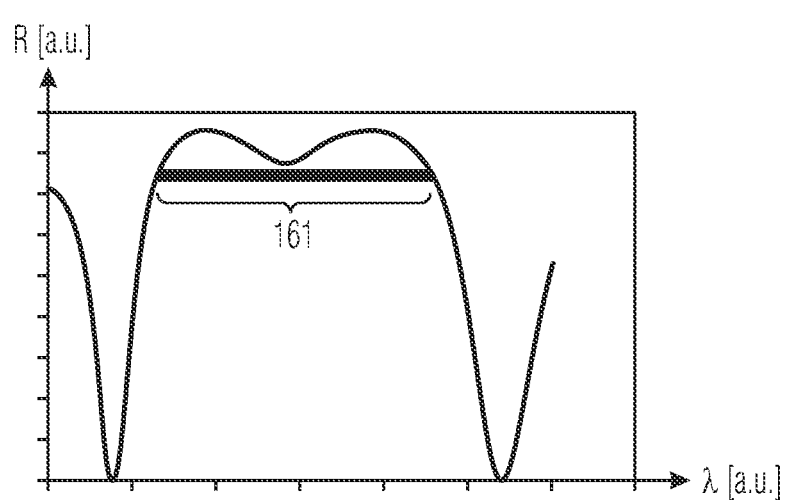
FIG. 5A illustrates reflection properties of a resonator mirror according to further embodiments.

FIG. 5A shows an example of a reflectance of a resonator mirror as a function of wavelength. As may be seen, there is a wavelength range 161 in which reflectance is so great that laser operation of the associated semiconductor laser is possible. The resonator mirror is designed as a Bragg mirror with 9 Bragg pairs and a dielectric material having a refractive index of 3.5 and 3.0 for adjacent layers.

Figure 5B:
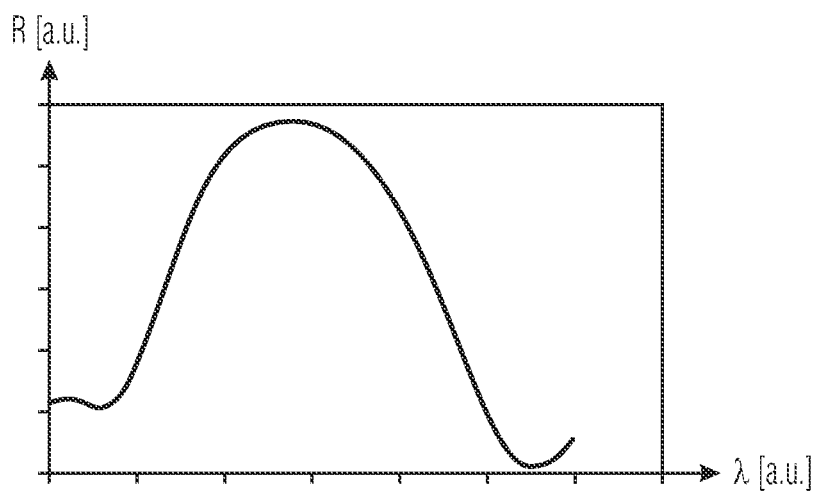
FIG. 5B illustrates reflection properties of a resonator mirror according to further embodiments.

FIG. 5B shows an example of the reflectance of a resonator mirror which is designed as a Bragg mirror and includes an absorbent layer 129 as described above. If the resonator mirror the reflectance of which is shown in FIG. 5A is combined with the resonator mirror the reflectance of which is shown in FIG. 5B to form a semiconductor laser, the reflectance shown in FIG. 5C results.

As may be seen, electromagnetic radiation of wavelengths less than $\lambda 3$ is absorbed. As a result, a reflectance having a relatively small wavelength range in which the reflectance is sufficient for laser operation is obtained. As a result, the emission wavelength of the semiconductor laser may be limited in a particularly effective manner.

As a result, a narrow and very well-defined wavelength-dependent reflectance may be realized. In this way, laser operation in a predetermined wavelength range may be achieved.

As has been described, it is possible to stably tune a semiconductor laser to a target wavelength by using a resonator mirror having a wavelength-dependent reflectance.

As will be explained below, different semiconductor lasers having the same reflectance of the first resonator mirror may produce different results, which may be attributed to the different interaction between gain spectrum and reflectance.

In general, the following condition applies at the lasing threshold of the lasing emission wavelength $\lambda_{lase}$:

$$\Gamma(\lambda_{lase},T)*g(\lambda_{lase},T)(th)=\alpha_i(\lambda_{lase},T)+\alpha_m(\lambda_{lase},T)$$

Here g(th) denotes the material gain at the lasing threshold, $\Gamma$ the confinement factor, $\alpha_i$ the intrinsic losses and $\alpha_m$ the mirror losses at $$\alpha_m = \frac{1}{2L}\ln\left(\frac{1}{R1(\lambda)R2(\lambda)}\right).$$

The loss curve may also be temperature dependent. However, since this change is usually comparably small, it is neglected for the purposes of the following explanation.

Figure 6A:
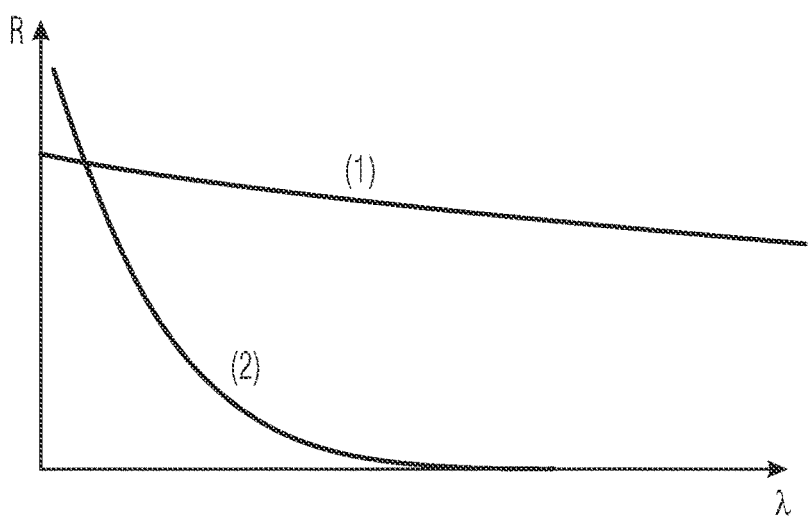
FIG. 6A illustrates various properties of a first resonator mirror.

In FIG. 6A, curve (1) illustrates the reflectance of a resonator mirror which depends on the wavelength only to a slight degree. Curve (2) shows the reflectance of a resonator mirror which drops sharply with increasing wavelength.

Figure 6B:
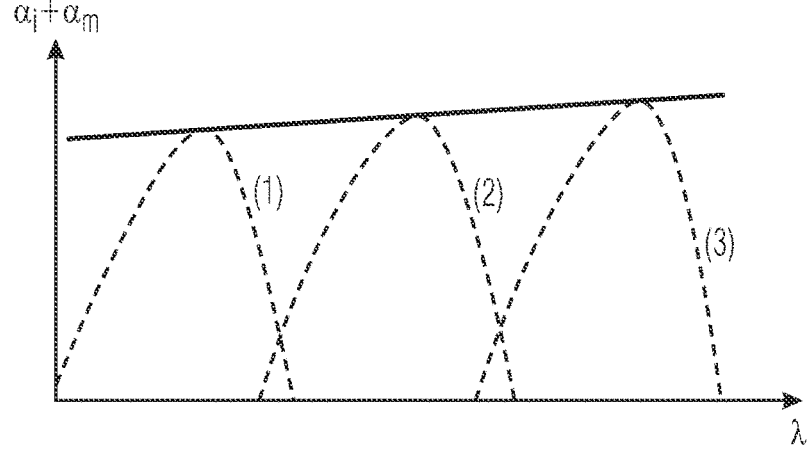
FIG. 6B illustrates the losses and gains of a laser at various temperatures when using a resonator mirror having approximately constant reflectance.

In FIG. 6B, the solid line illustrates the losses of a laser having the reflectance designated as (1) in FIG. 6A. Since the latter decreases only slightly with increasing wavelength, the losses increase only slightly with increasing wavelength.

The dashed line depicts the product $\Gamma^*g(\lambda,T)$ for various temperatures and almost constant current levels. With increasing temperature, the gain curve, including the gain peak, shifts to larger wavelengths. At the lasing threshold, the product $\Gamma^*g(\lambda,T)$ takes the value $\alpha_i+\alpha_m$.

The curves (1) to (3) in FIG. 6B each show the product $\Gamma^*g(\lambda,T)$ for increasing temperatures. In the curves shown, the laser condition is achieved for different wavelengths in each case. As may be seen, the emission wavelength shifts strongly with increasing temperature.

Figure 6C:
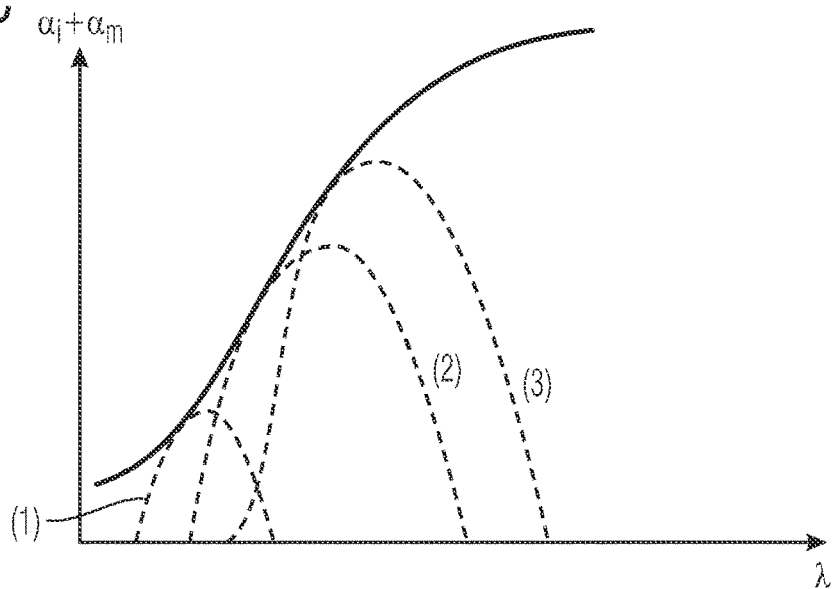
FIG. 6C illustrates the losses and gains of a laser at different temperatures when using a resonator mirror having sharply decreasing reflectance.

In FIG. 6C, the solid line illustrates the losses of a laser with the reflectance designated as (2) in FIG. 6A. Since the latter drops very sharply with increasing wavelength, the losses increase very sharply with increasing wavelength.

The dashed line shows the product $\Gamma^*g(\lambda,T)$ for various temperatures and currents levels (i.e. charge carrier densities). With increasing temperature, the gain curve, including the gain peak, shifts to larger wavelengths. At the lasing threshold, the product $\Gamma^*g(\lambda,T)$ takes the value $\alpha_i+\alpha_m$. The lasing threshold is met when the dashed curve indicating the product $\Gamma^*g(\lambda,T)$ touches the loss curve $\alpha_i+\alpha_m$.

The curves (1) to (3) in FIG. 6C each show the product $\Gamma^*g(\lambda,T)$ for increasing temperatures. In the curves shown, the laser condition is achieved for different wavelengths in each case. However, since the losses increase sharply with increasing wavelength, the lasing threshold is already reached at wavelengths shorter than that at which the gain peak is present. Accordingly, the emission wavelength shifts less strongly with increasing temperature than shown in FIG. 6B.

Figure 6D:
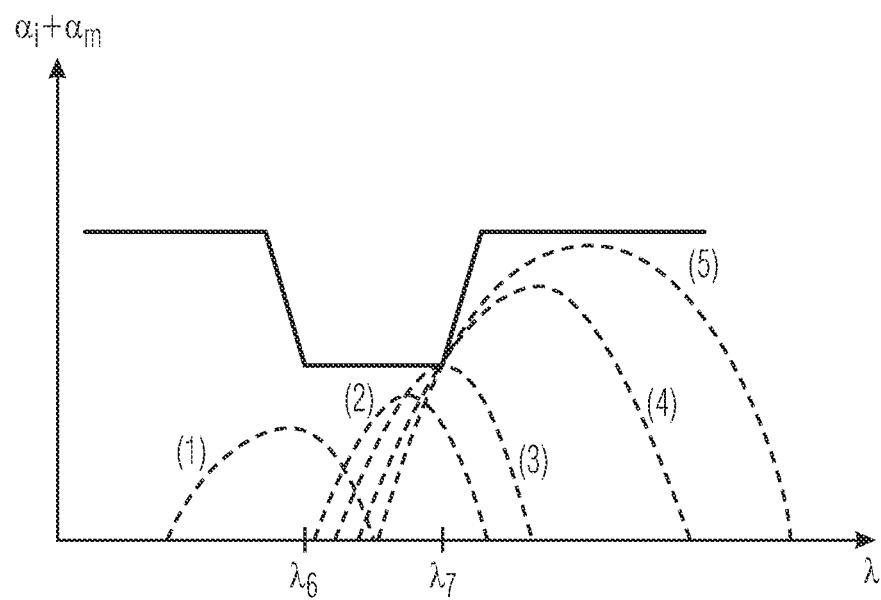
FIG. 6D illustrates the losses and gains of a laser at various temperatures and electric currents.

In FIG. 6D, the solid line illustrates the losses of a laser. The losses have a minimum in the wavelength range from $\lambda_6$ to $\lambda_7$. These are due to corresponding maximum values of the reflectance of the first and second resonator mirrors. The dashed line shows the product $\Gamma^*g(\lambda,T)$ for various temperatures and current levels (i.e. charge carrier densities). With increasing temperature, the gain curve, including the gain peak, shifts to larger wavelengths. At the lasing threshold, the product $\Gamma^*g(\lambda,T)$ takes the value $\alpha_i+\alpha_m$.

The curves (1) to (5) in FIG. 6D each show the product $\Gamma^*g(\lambda,T)$ for increasing temperatures and current levels. In FIG. 6D, the lasing threshold has not yet been reached at temperature $T_1$ in curve (1) and at temperature $T_2$ in curve (2). In curve (3), laser emission occurs at temperature $T_3$ at wavelength $\lambda_0=\lambda_7$. If the temperature now continues to rise to $T_4$, emission continues to occur at wavelength $\lambda_0=\lambda_7$, as shown by curve (4) due to the special shape of the curve of $\Gamma^*g(\lambda,T4)$. In particular, the emission wavelength remains stable if the loss curve $(\alpha_i+\alpha_m)(\lambda,T)$ rises more sharply than the gain curve $\Gamma^*g(\lambda,T)$. As a result, the threshold condition is not necessarily stabilized at the wavelength of the gain peak but at $\lambda_0$. The emission wavelength also remains stable according to curve (5) at temperature $T_5$.

The broader the gain spectrum, the sooner the threshold condition (regardless of the temperature) is reached at a distance from the gain peak and near or at the target wavelength. If, on the other hand, the gain spectrum is narrower, the gain peak is higher at a lower charge carrier density and the threshold is reached at a lower current intensity. This however leads to only a narrower spectral range being amplified in return.

Figure 6E:
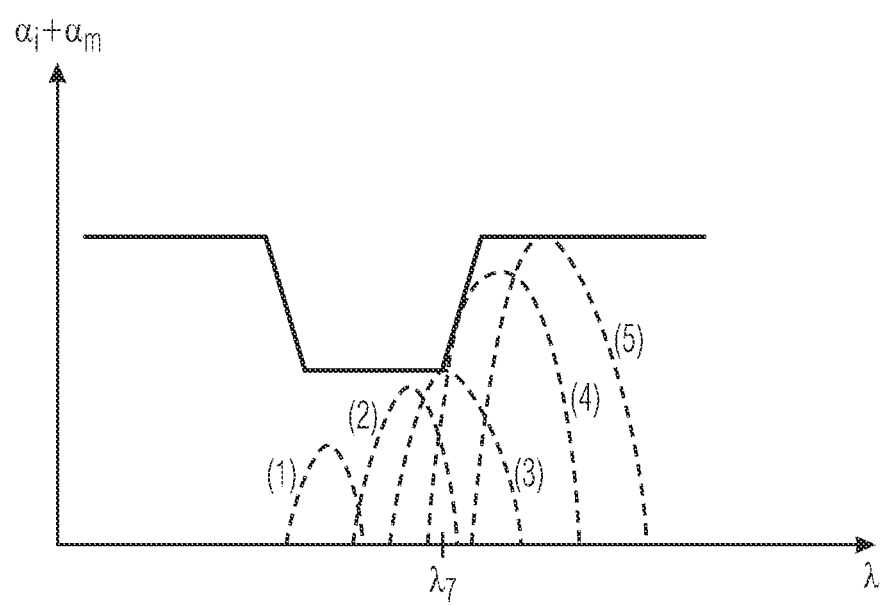
FIG. 6E illustrates the losses and gains of a laser at various temperatures and electric currents.

This is illustrated in FIG. 6E. Here, it is assumed that the semiconductor laser comprises a first resonator mirror having the same reflectance as the reflectance of the resonator mirror of the semiconductor laser, the characteristics of which have been discussed with reference to FIG. 6D. For example, the first resonator mirror used for FIG. 6D and the first resonator mirror used for FIG. 6E are identical. Unlike in the case discussed in FIG. 6D, the semiconductor laser has a narrower gain spectrum.

The curves (1) to (5) in FIG. 6E each also show the product $\Gamma^*g(\lambda,T)$ for increasing temperatures and current levels. In FIG. 6E, the lasing threshold has not yet been reached at temperature $T_1$ in curve (1) and at temperature $T_2$ in curve (2). In curve (3) at temperature $T_3$, laser emission occurs at wavelength $\lambda_0=\lambda_7$. If the temperature now continues to rise to $T_4$, emission now occurs at a wavelength $\lambda_0>\lambda_7$, as shown by curve (4) due to the special shape of the curve of $\Gamma^*g(\lambda,T4)$. Since the loss curve $(\alpha_i+\alpha_m)(\lambda,T)$ rises less sharply than the gain curve $\Gamma^*g(\lambda,T)$, the emission wavelength shifts to longer wavelengths. As a result, the threshold condition is shifted towards the wavelength of the gain peak, i.e. the maximum gain. According to curve (5), at temperature $T_5$, laser emission takes place at signifimaytly greater wavelengths. Due to the narrower gain bandwidth, wavelength stabilization only takes effect in a smaller temperature range than in FIG. 6D.

As a result, the emission wavelength always stays close to the gain peak wavelength, regardless of the loss curve. As a result, the emission wavelength changes more pronouncedly with temperature.

Figure 6F:
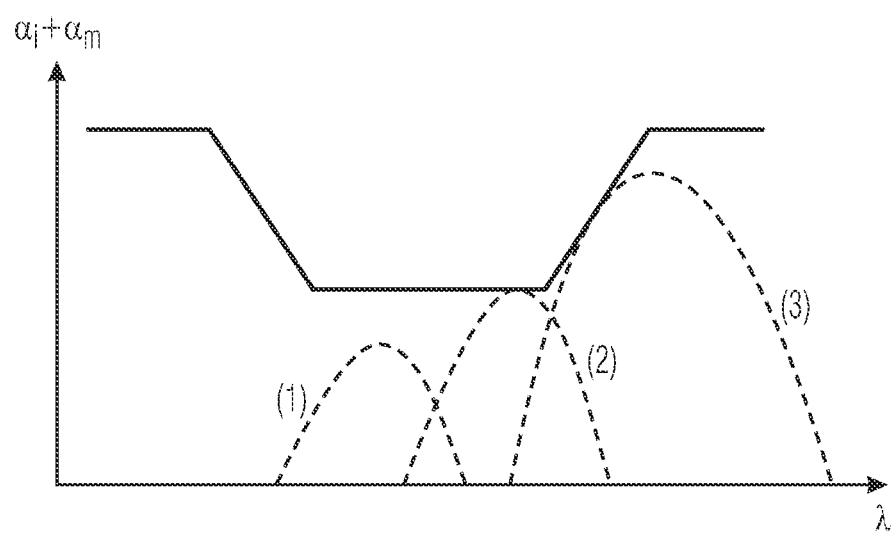
FIG. 6F illustrates the losses and gains of a laser at various temperatures and electric currents.

For comparison, FIG. 6F is a representation in which the curve of $\alpha_i+\alpha_m$ represented by a solid line has less steep slopes due to a different behavior of the reflectance of the first resonator mirror. The losses have a minimum in the wavelength range from $\lambda_6$ to $\lambda_7$. These are again due to corresponding maximum values of the reflectance of the first and second resonator mirrors. The curves (1) to (3) each show the product $\Gamma^*g(\lambda,T)$ for increasing temperatures and current levels in dashed lines. With increasing temperature, $\Gamma^*g(\lambda,T)$ shifts to greater wavelengths. In FIG. 6F the lasing threshold has not yet been reached at temperature $T_1$ in curve (1). In curve (2) at temperature $T_2$, the lasing threshold is reached and the product $\Gamma^*g(\lambda,T)$ takes the value $\alpha_i+\alpha_m$. Since $\Gamma^*g(\lambda,T)$ shifts further into the long-wave range for subsequent temperatures and the slope of the gain curve is steeper than the slope of the loss $\alpha_i+\alpha_m$, the emission wavelength nevertheless increases with increasing temperature.

Therefore, according to embodiments, the steepness of the loss curve compared to the gain curve must also be taken into account for stabilizing the lasing wavelength at changing temperatures.

According to embodiments, in the case of the semiconductor laser, a sum of intrinsic losses of the semiconductor laser and mirror losses caused by the first and second resonator mirrors may increase for wavelengths $\lambda$ within a range of $\lambda_0<\lambda<\lambda_0+\Delta\lambda$.

For example, the sum of the intrinsic losses of the semiconductor laser and the mirror losses may rise at least half as steeply as a curve that corresponds to the product of the confinement factor $\Gamma(\lambda,T)$ and the wavelength-dependent gain $g(\lambda,T)$.

According to further embodiments, the sum of the intrinsic losses of the semiconductor laser and the mirror losses may rise more steeply than a curve that corresponds to the product of the confinement factor Γ(λ,T) and the wavelength-dependent gain g(λ,T).

In this case, as explained above with reference to FIGS. 6D, 6E, and 6F, the emission wavelength may be kept stable in a broader temperature range, for example, −40° C. to 140° C.

For example, a comparatively broad gain spectrum and thus also a less steep increase in the product of the confinement factor Γ(λ,T) and the wavelength-dependent gain g(λ,T) may be achieved by the active zone comprising a smaller number of quantum well structures. A broader gain spectrum may also be achieved by a shorter resonator length, for example less than 1.5 mm, by a low reflectance of the second and/or the first resonator mirror and by a high charge carrier density at the lasing threshold. As a result, a broad gain spectrum may be achieved at or above the lasing threshold, for example.

Examples for adjusting the reflectance of the first and, if applicable, the second resonator mirrors are explained below.

Figure 6G:
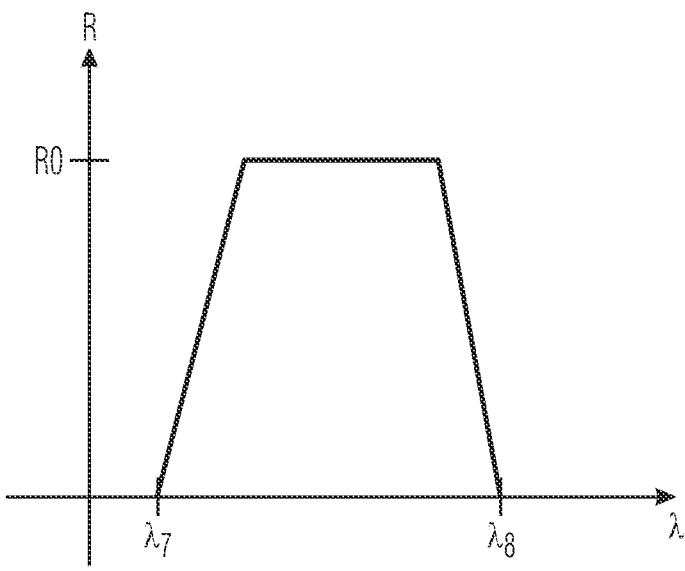
FIG. 6G illustrates reflection properties of a resonator mirror according to further embodiments.

FIG. 6G shows the course of the reflectance R, for example of the first resonator mirror 125, or as a product of the reflectance of the first and second resonator mirrors for a semiconductor laser according to embodiments. As may be seen, in this case, too, the reflectance is at a relatively high level over a broad wavelength range. For example, R0 may range from 0.05 to 0.15. The width, for example the difference between $\lambda_7$ and $\lambda_8$, may correspond to the width of the target wavelength spectrum, for example.

Figure 6H:
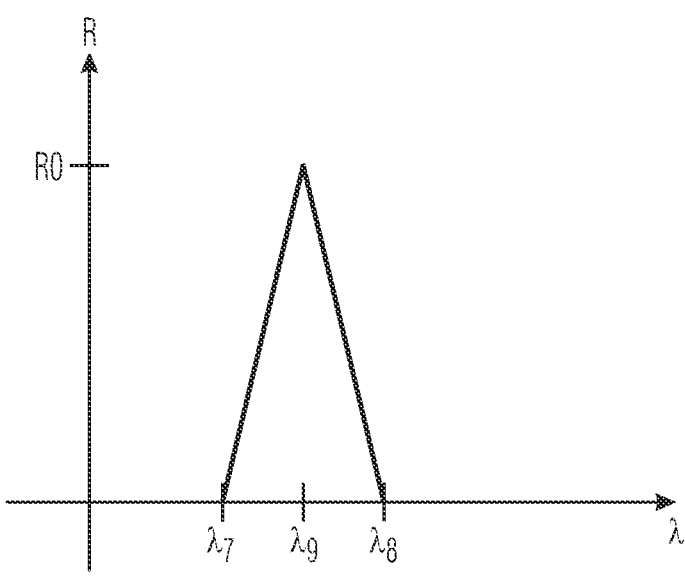
FIG. 6H illustrates reflection properties of a resonator mirror according to further embodiments.

FIG. 6H shows the course of the reflectance R, for example of the first resonator mirror 125, or as a product of the reflectance of the first and second resonator mirrors for a semiconductor laser according to further embodiments. As may be seen, in this case, too, the reflectance is at a relatively high level over a narrow wavelength range. For example, R0 may range from 0.05 to 0.15. The width, for example the difference between $\lambda_7$ and $\lambda_8$, may correspond to the width of the target wavelength spectrum, for example.

In FIGS. 6G and 6H, the reflectance for wavelengths less than $\lambda_7$ or greater than M is comparatively low in a range where the gain of the laser is still greater than 0, for example less than 0.01 or than 0.005.

For example, the course of the reflectance shown in FIG. 6G may be achieved by a suitable combination of the reflectance of the first and second resonator mirrors.

Figure 6I:
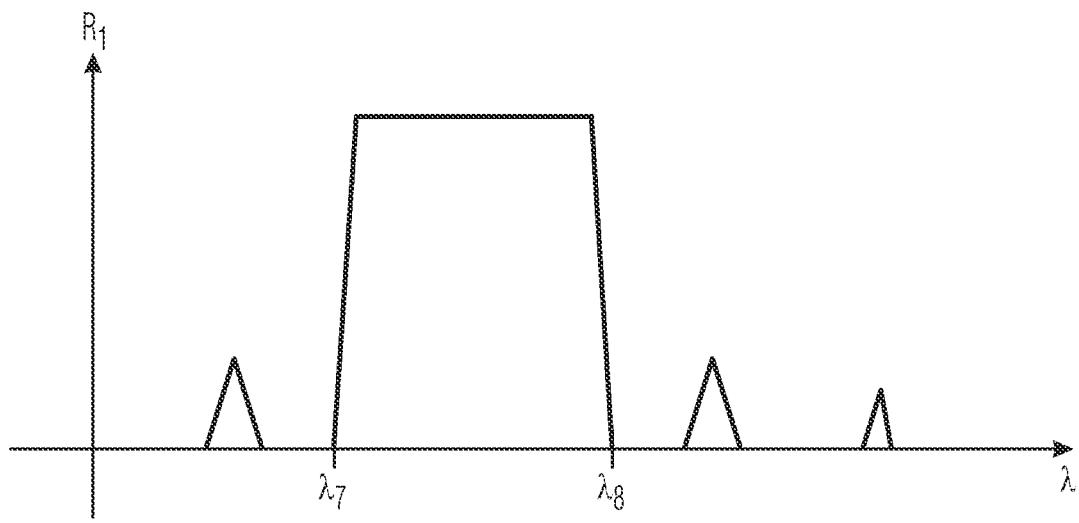
FIG. 6I illustrates the combination of reflection properties of resonator mirrors according to further embodiments.
Figure 6I:
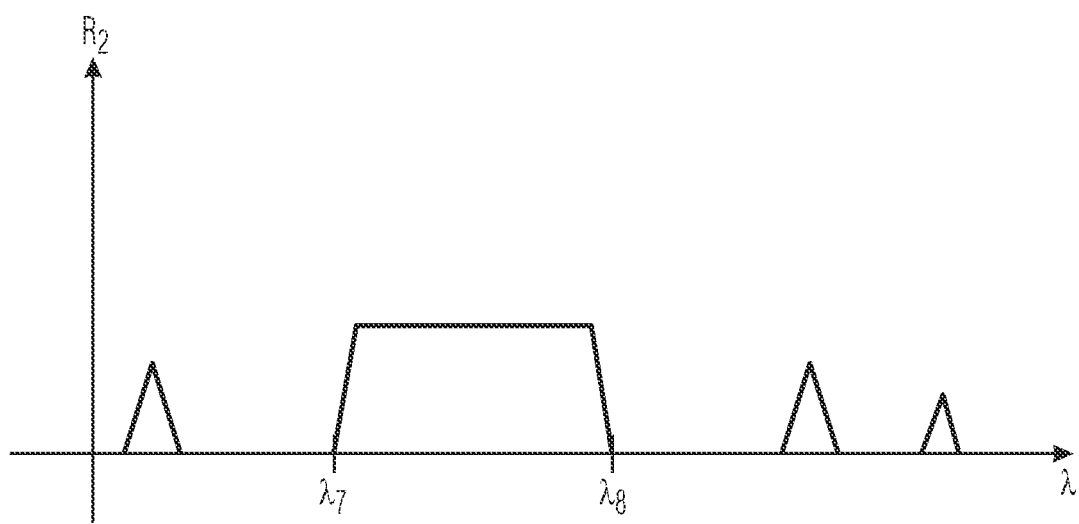

This is illustrated in FIG. 6I. In FIG. 6I the reflectance R1 of the first resonator mirror is shown in the upper part, the reflectance R2 of the second resonator mirror is shown in the lower part. Both R1 and R2 have an initial steep rise to a maximum at wavelength $\lambda_7$ and a drop at $\lambda_8$. In the wavelength range below $\lambda_7$ and above $\lambda_8$, local maxima occur with a reflectance that is non-zero but low in each case. These maxima are arranged at different wavelength ranges for R1 and R2, and the reflectance drops to 0 in the ranges between the local maxima. If the combined reflectance is formed as the product of R1 and R2, this combined reflectance has the value 0 for wavelengths less than $\lambda_7$ and greater than $\lambda_8$. At $\lambda_7$, the combined reflectance increases to a higher value than either R1 or R2. At $\lambda_8$, the combined reflectance drops back to 0 as shown in FIG. 6G.

Figure 6K:
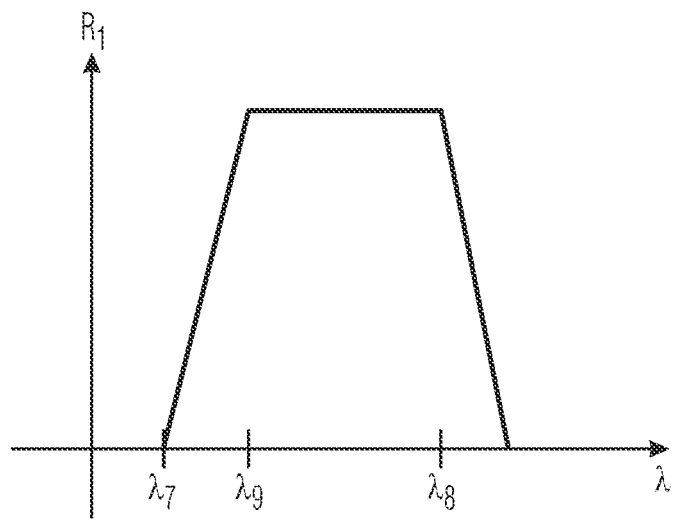
FIG. 6K illustrates the combination of reflection properties of resonator mirrors according to further embodiments.
Figure 6K:
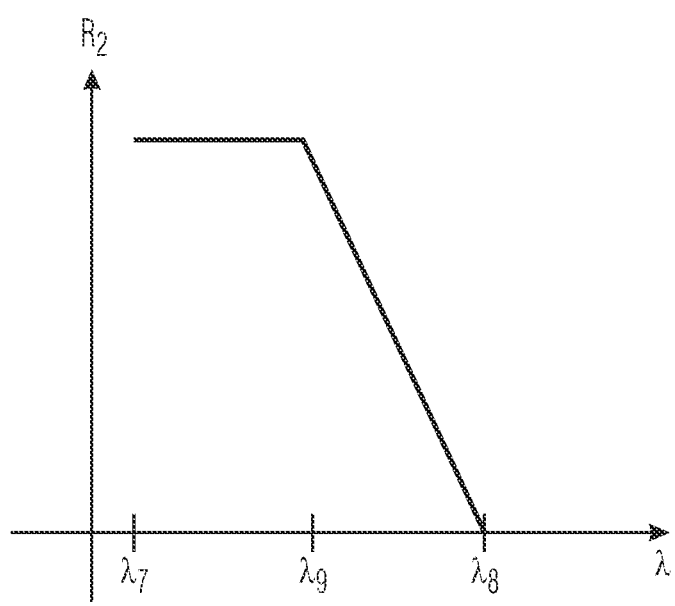

For example, the course of the reflectance shown in FIG. 6H may be achieved by a suitable combination of the reflectance of the first and second resonator mirrors, as illustrated in FIG. 6K.

The left part of FIG. 6K shows the reflectance R1 of the first resonator mirror, the right part shows the reflectance R2 of the second resonator mirror. R1 initially increases starting at wavelength $\lambda_7$. In this range, R2 is at a maximum constant level. As a result, the combined reflectance increases in this region. The maximum of the reflectance R1 and also of the combined reflectance is located at wavelength $\lambda_9$. From wavelength $\lambda_9$, the reflectance R1 remains at a maximum constant level and drops again at $\lambda_8$. From wavelength $\lambda_9$ the reflectance R2 of the second resonator mirror drops to the value 0 at $\lambda_8$. As a result, the combined reflectance drops from $\lambda_9$ and reaches zero at $\lambda_8$.

Figure 5C:
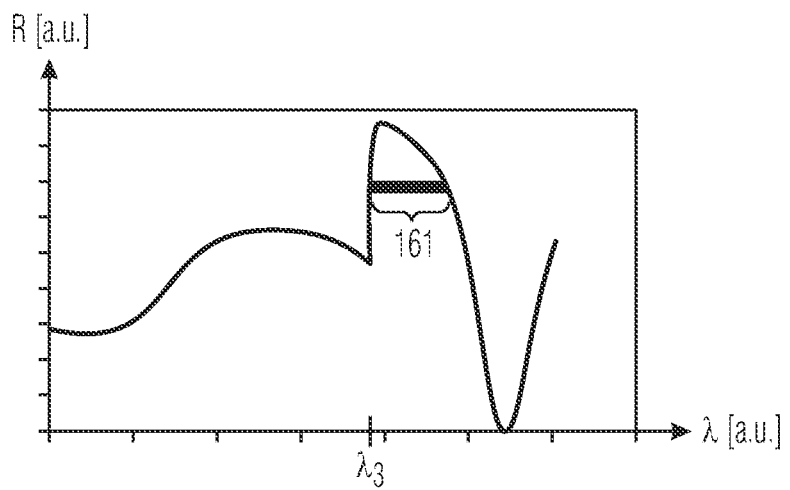
FIG. 5C illustrates combined reflection properties of resonator mirrors according to further embodiments.

According to further embodiments, steep courses of the reflectance may be realized by incorporating absorbent layers into the Bragg mirror as explained with reference to FIGS. 4 to 5C.

Figure 7A:
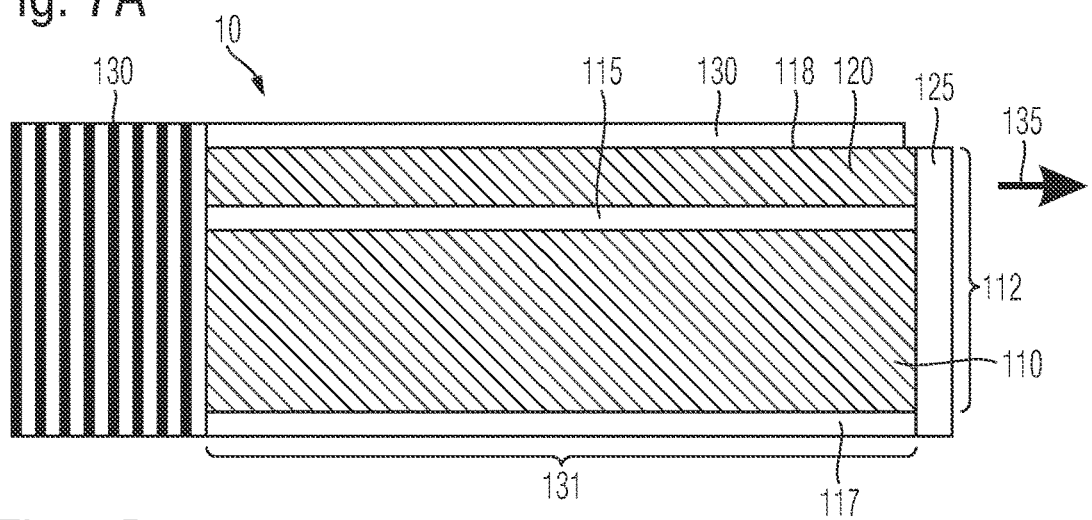
FIG. 7A shows a cross-sectional view of a semiconductor laser according to embodiments.

FIG. 7A illustrates a schematic cross-sectional view of a semiconductor laser according to embodiments in which the first resonator mirror 125 having wavelength-dependent reflectance has a lower reflectance than the second resonator mirror 130. The first resonator mirror 125 thus represents the outcoupling mirror for outcoupling the generated electromagnetic radiation 135. The semiconductor laser 10 comprises a first semiconductor layer 110 of a first conductivity type, for example p-type, and a second semiconductor layer 120 of a second conductivity type, for example n-type. The semiconductor laser further includes an active zone 15 arranged between the first and the second semiconductor layers. The semiconductor laser 10 is based on the AlGaInAs/GaAs material system. For example, the active zone may include a plurality of, for example 3, laser elements arranged one above the other with double quantum well structures, by means of which, for example, a wavelength of 905 nm may be emitted. The optical resonator 131 is arranged between the first resonator mirror 125 and the second resonator mirror 130. The optical resonator 131 extends in a direction parallel to a first main surface 111 of the semiconductor layer arrangement 112. For example, the length of the optical resonator 131 may be less than 1.5 mm, for example less than 1200 μm, for example approximately 600 μm. A first contact element 117 is arranged in electrical contact with the first semiconductor layer 110. A second contact element 118 is arranged in electrical contact with the second semiconductor layer 120.

The first resonator mirror 125 has a structure and a reflectance which will be explained in more detail below with reference to FIG. 7C.

The embodiments described herein are based on the observation that, at a low reflectance of the first resonator mirror 125 of less than 10%, for example less than 1%, a blue shift in the emission wavelength may occur. This blue shift is due to the fact that a charge carrier density at the lasing threshold increases as the temperature rises. This is due to the decreasing gain with increasing temperature. As a result, the gain maximum is shifted to shorter wavelengths with increasing temperature. According to the embodiments described herein, this effect is combined with suitably adjusted reflection behavior as a function of the wavelength in such a way that the emission wavelength of the semiconductor laser is stabilized.

The second resonator mirror 130 may, for example, have a reflectance that is greater than 96% in the wavelength range under consideration. For example, the second resonator mirror 130 may be designed as a Bragg mirror and may include more than 2 pairs of layers, for example 3 pairs of layers. For example, the layers of the second resonator mirror 130 may include a suitable dielectric material and silicon.

Figure 7B:
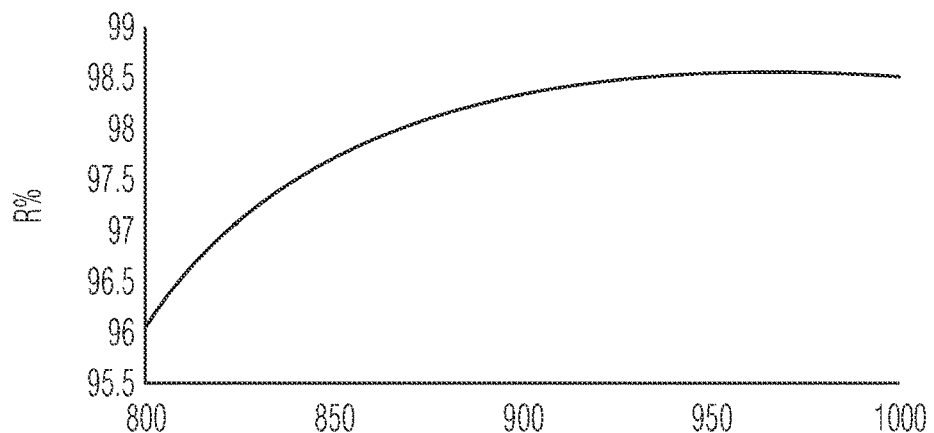
FIG. 7B shows the reflectance of a second resonator mirror according to embodiments.

FIG. 7B shows the reflectance of the second resonator mirror 130 as a function of wavelength. As may be seen, the reflectance of about 96% initially increases with increasing wavelength and then remains at a value of about 98.5%. This value is reached at around 905 nm.

Figure 7C:
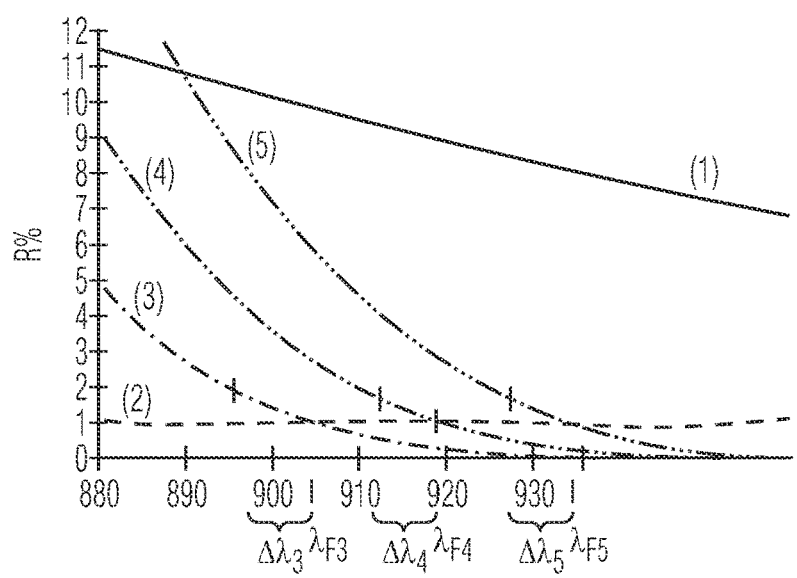
FIG. 7C shows the reflectance of a first resonator mirror according to embodiments.

FIG. 7C shows reflectance as a function of wavelength for various mirrors. The reflectance shown at (1) drops linearly from about 12% at about 880 nm to about 7.3% at 960 nm. The reflectance represented at (2) is nearly constantly at about 1% in the observed wavelength range between 880 nm and 960 nm. For example, the mirror that shows the reflection behavior shown at (2) may comprise several pairs of AlO/TaO layers.

The reflectance shown at (3) drops from a value of about 5% at 880 nm to a value of 1% at 905 nm and remains below 1% in the wavelength range up to 960 nm. A first characteristic value for characterizing the reflectance is the so-called base point $\lambda_F$, i.e. the wavelength at which the reflectance has dropped to 1%. At 1% reflectance, the effect of the blue shift in wavelength is clearly perceivable, as will be discussed later. The base point $\lambda_{F3}$ for curve (3) is 905 nm in this case. Another characteristic value is the negative slope, which is reached, for example, between a reflectance of 1% and 2%, i.e., $\Delta_3 = \Delta R \%/\Delta\lambda_3 \sim 0.11\%/nm$. The first resonator mirror having the reflectance shown in curve (3) is constructed as a Bragg mirror with a suitable combination of a plurality of thin layers, resulting in this special wavelength-dependent reflectance. The reflectance shown at (4) drops from a value of about 9.8% at 880 nm to a value of 1% at 920 nm and remains below 1% in the wavelength range up to 960 nm. The base point $\lambda_{F4}$ for curve (4) is 920 nm in this case. The negative slope between the reflectance of 1% and 2% is $\Delta_4 = \Delta R \%/\Delta\lambda_4 \sim 0.19\%/nm$. The first resonator mirror having the reflectance shown in curve (4) is constructed as a Bragg mirror with a suitable combination of a plurality of thin layers, resulting in this special wavelength-dependent reflectance.

The reflectance shown at (5) drops from a value of about 11.3% at 890 nm to a value of 1% at 935 nm and remains below 1% in the wavelength range up to 960 nm. The base point $\lambda_{F5}$ for curve (5) is 935 nm in this case. The negative slope between the reflectance of 1% and 2% is $\Delta_5 = \Delta R \%/\Delta\lambda_5 \sim 0.16\%/nm$. The first resonator mirror having the reflectance shown in curve (5) is constructed as a Bragg mirror with a suitable combination of a large number of thin layers, resulting in this special wavelength-dependent reflectance.

The following applies to the reflectance of the first resonator mirror in the range of the target wavelength $\lambda_0$: $dR/d\lambda < k/nm$ for $\lambda = \lambda_0$ with $k \leq -0.1\%$. Unlike, for example, in FIG. 2A or 2B, the reflectance at $\lambda = \lambda_0$ does not drop from a local maximum in this case, but the reflectance already drops significantly for wavelengths less than $\lambda_0$. This clearly different behavior of the reflectance in relation to the wavelength is due to the fact that the reflectance is considered within a range of less than 12%. at A semiconductor laser having a reflectance of the first resonator mirror in this range achieves wavelength stabilization via effects other than, for example, in embodiments in which the reflectance of the first resonator mirror shows the behavior shown in FIGS. 2A and 2B. In the embodiments described herein, the reflection behavior of the first resonator mirror is kept at low values, so that a blue shift in the emission wavelength compensates for the red shift with temperature.

In general, for example, the reflectance of the first resonator mirror 125 within the range of the target wavelength of the semiconductor laser 10 is less than 10%, according to further embodiments less than 5%.

Further properties of the semiconductor laser 10 having the structure shown in FIG. 7A in which the first resonator mirror 125 has the structure discussed with reference to FIG. 7C will be explained below.

Figure 7D:
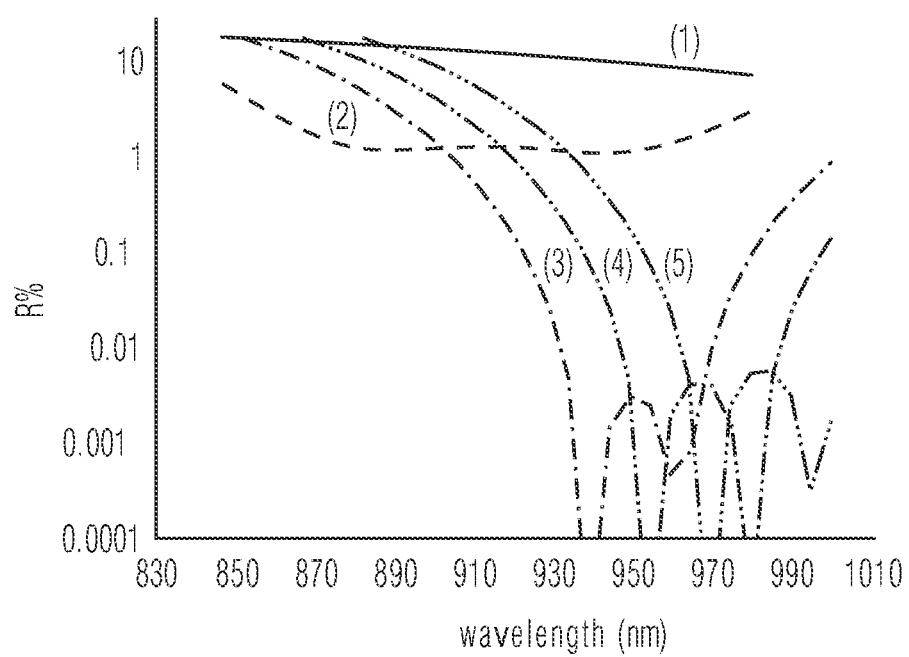
FIG. 7D shows the reflectance of the first resonator mirror according to embodiments.

FIG. 7D illustrates the reflectance of the first resonator mirror 125, each having a different structure as discussed above, over a larger wavelength range between 850 nm and 1000 nm. As may be seen, the reflectance may increase again for greater wavelengths. However, the reflectance should be such that a sufficiently wide "stop range" of the first resonator mirror is ensured. For example, the wavelength at which the reflectance becomes >1% may be selected according to the gain bandwidth of the active zone, so that this wavelength is in a region of very low gain, for example. In this way it may be avoided that laser emission in this higher wavelength range is caused. In FIG. 7D, the reflectance numbering refers to the same resonator mirrors the reflectances of which are shown in FIG. 7C.

Figure 8A:
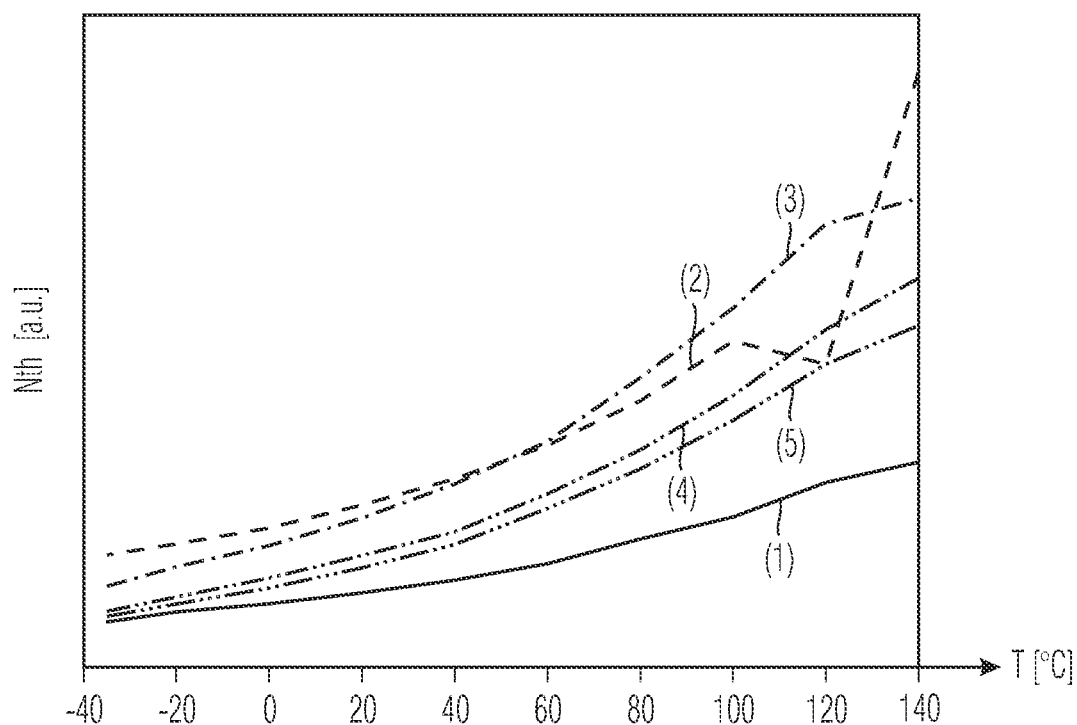
FIG. 8A illustrates a charge carrier density in the active zone at the lasing threshold for different semiconductor lasers according to embodiments.

FIG. 8A shows the calculated charge carrier density at the lasing threshold Nth as a function of temperature for semiconductor lasers having the structure shown in FIG. 7A in which the respective first resonator mirror has the properties described with reference to FIG. 7C and the associated structure. As may be seen, the first resonator mirror 125 having the reflectance as discussed in curve (1) in FIG. 7C has the lowest charge carrier density Nth at the lasing threshold and the lowest dependence of the charge carrier density Nth on temperature. This is due to the fact that low mirror losses occur owing to the high reflectance of the first resonator mirror which is wavelength-dependent only to a low degree. As a result, a low threshold gain occurs, leading to a comparatively low carrier density. In general, the charge carrier density Nth at the lasing threshold increases with increasing temperature. This is due to the decreasing gain with increasing temperature.

For the first resonator mirror having the reflectance indicated by curve (2), this reflectance remains nearly constantly at a fairly low value. In this case, the number of charge carriers at the lasing threshold in the range from −40° C. to +40° C. is greater than in the first resonator mirrors having the reflectances shown in curves (3) to (5).

For the first resonator mirror having the reflectance indicated by curve (3), the reflectance already reaches the comparatively low reflectance of 1% at a wavelength of 905 nm. In this case, the carrier density Nth at the lasing threshold up to a temperature of about 50° C. is lower than in curve (2) but higher than in curves (1), (4), and (5). Within a temperature range greater than about 50° C., the charge carrier density at the lasing threshold is higher than in curve (2) and also higher than in curves (1), (4), and (5).

As may be seen from an overall comparison of curves (1) to (5), the dependency of the charge carrier density Nth at the lasing threshold with temperature is greater according to curves (2) to (5) compared to curve (1). Accordingly, this dependency is larger for the first resonator mirrors having a structure that results in a reflectance according to curves (2) to (5) in FIG. 7C than for the resonator mirror according to curve (1).

In general, in curves (3) to (5), in a temperature range from 0° to 60° C., the charge carrier density at the lasing threshold increases by more than 25%, for example more than 30% or 35%.

Due to the increase in charge carrier density Nth at the lasing threshold with temperature, there is a clear blue shift with temperature for resonator mirrors according to curves (2) to (5) compared to the resonator mirrors according to curve (1).

In general, the aim is to increase the charge carrier density Nth at the lasing threshold to such a level that the resulting blue shift compensates for the red shift caused by the band gap reduction, so that the emission wavelength may be stabilized over a wide temperature range.

The lower the differential gain dg/dN, the greater the increase in the charge carrier density at the lasing threshold which is caused by a reduction in gain caused by an increase in temperature. The spectral gain maximum as a function of the carrier density roughly follows the empirical formula g=g0*ln(N/Ntr) featuring the gain coefficient g=and the transparency carrier density Ntr. The differential gain is found as dg/dN=g0/N. It decreases rapidly with increasing carrier density. The charge carrier density change at the lasing threshold with temperature thus increases rapidly with the initial threshold carrier density. In this context, the initial threshold carrier density refers to the threshold carrier density at a suitable reference temperature, for example room temperature or the lower limit of the temperature range under consideration, e.g. −40° C.

In the case of conventional laser diodes, the gain and the differential gain are usually maximized if possible in order to achieve greater efficiency. According to embodiments, the wavelength-stabilized laser diode described herein is designed such that it has an increased charge carrier density at the lasing threshold compared to conventional laser diodes and, as a result, has only a small differential gain. Stabilization of the wavelength comes at the price of the resulting loss of efficiency. The loss of efficiency may be limited by suitable design and optimization.

Figure 8B:
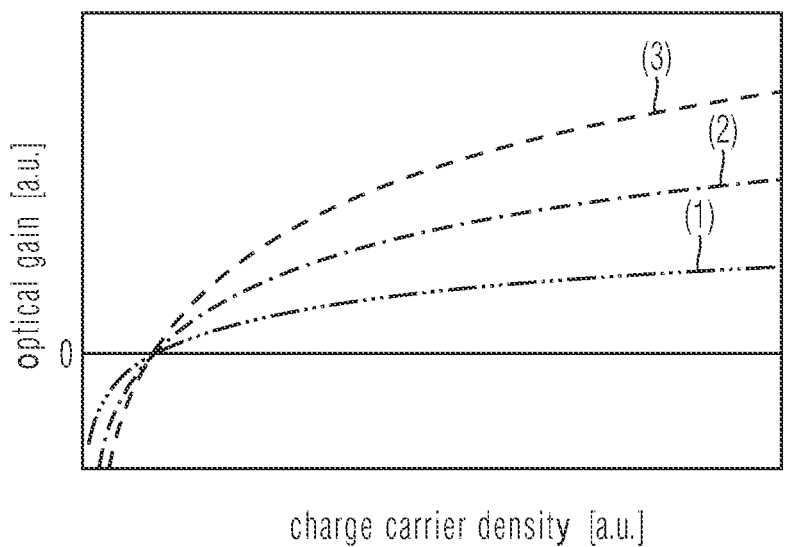
FIG. 8B illustrates the optical gain for various semiconductor lasers according to embodiments.

According to embodiments, for example, the active zone may exclusively comprise a single quantum well structure. FIG. 8B shows a plot of optical gain as a function of carrier density for a semiconductor laser comprising a single quantum well structure (curve (1)), a double quantum well structure (curve (2)), and a triple quantum well structure (curve (3)).

Figure 8C:
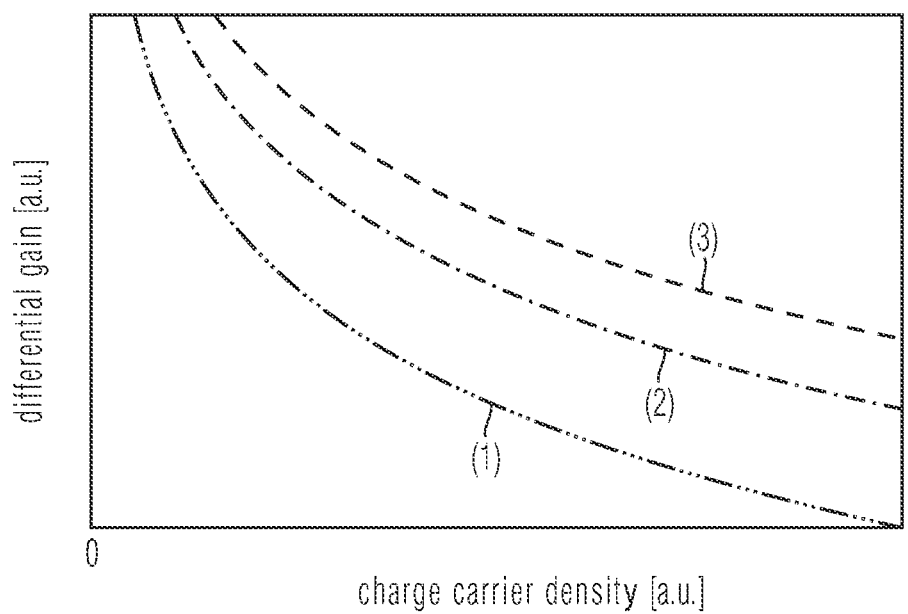
FIG. 8C illustrates the differential gain for various semiconductor lasers according to embodiments.

FIG. 8C shows a plot of differential gain as a function of carrier density for the semiconductor laser comprising a single quantum well structure (curve (1)), a double quantum well structure (curve (2)), and a triple quantum well structure (curve (3)).

As may be seen, the differential gain decreases for a smaller number of quantum films, that is, for the single quantum well structure, compared to the multiple quantum well structure. Accordingly, a low number of quantum films or quantum well structures is favorable for wavelength stabilization.

Usually, the optical gain may be increased by a higher number of quantum films, resulting in higher efficiency. Conversely, as described herein, temperature stability may be increased by using a single quantum well structure.

Figure 9A:
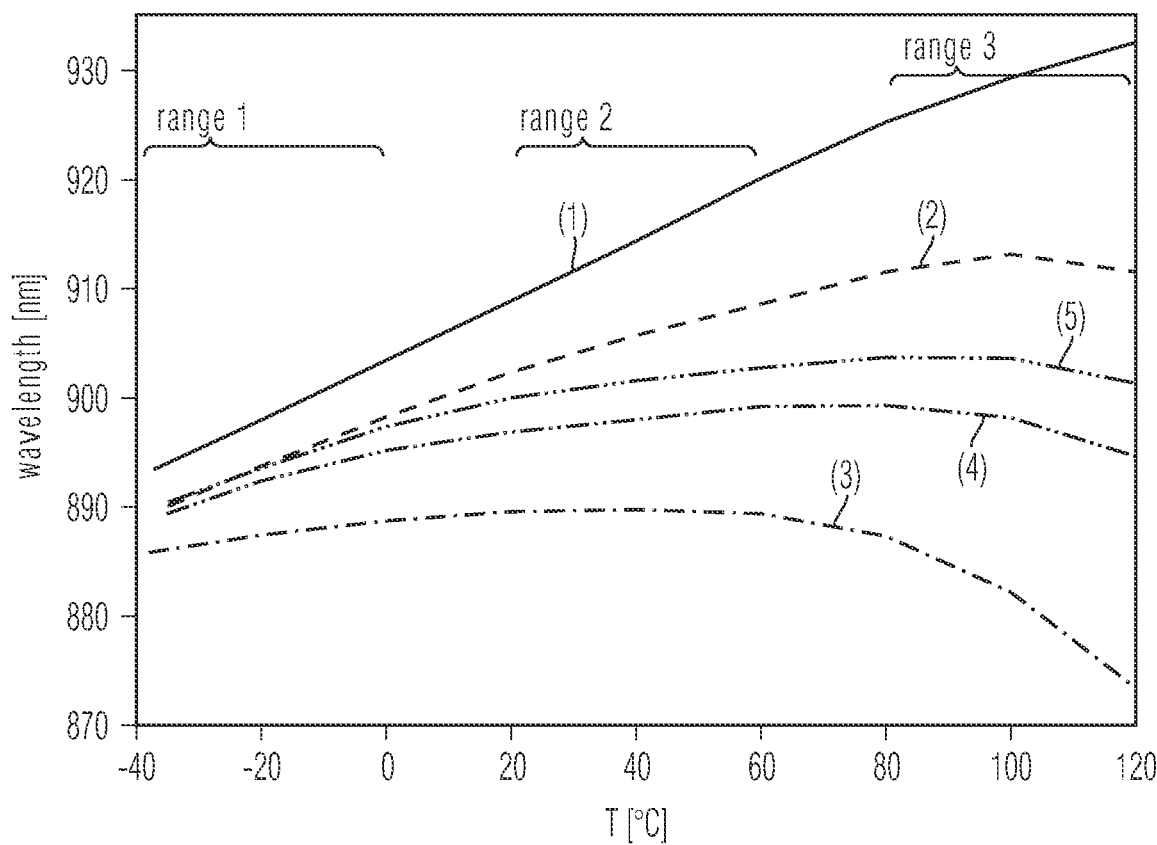
FIG. 9A illustrates the course of the emission wavelength over temperature for various semiconductor lasers according to embodiments.

FIG. 9A shows experimental data of the emission wavelength of a pulsed laser as a function on the temperature of a heat sink of the pulsed laser in a temperature range of −40° C. to 120° C. The layer structure of the semiconductor laser and the active zone are designed such that at 20° C., for example, an emission wavelength is 905 nm. The semiconductor laser comprises several laser elements stacked one above the other as shown in FIG. 1B. The active zone of the semiconductor laser, for example, comprises a multiple quantum well structure. For example, 3 laser elements as shown in FIG. 1B are stacked one above the other, each comprising double quantum well structures. A current intensity of 40 A was impressed into the semiconductor laser, for example by applying an appropriate voltage to the first and second contact elements 117, 118. FIG. 9A shows five different curves, in which semiconductor lasers were used each having the properties and layer structure discussed with reference to FIG. 7C.

Curve (1) shows the wavelength of a semiconductor laser comprising a first resonator mirror 125, the reflectance of which drops linearly from 880 nm from 12% to about 7.2% at 960 nm. The emitted wavelength of this semiconductor laser increases napproximately linearly from a value of about 892 nm at −40° C. to a value of about 935 nm at 120° C. In ranges 1 and 2 between −40° C. and 60° C. this corresponds to the expected red shift of about 0.27 nm/K due to the reduction of the band gap with temperature. In range 3 between 80° C. and 120° C., this effect is masked to a small degree by a blue shift. The blue shift results from an increased charge carrier density Nth at the lasing threshold, as shown in FIG. 8A also.

Curve (2) shows the wavelength of a semiconductor laser comprising a first resonator mirror 125, the reflectance of which is nearly constantly at 1% in the range from 880 to 960 nm. The emitted wavelength of this semiconductor laser increases continuously from a value of about 888 nm at −40° C. to a value of about 913 nm at 100° C. In range 1 between −40° C. and 0° C., this increase corresponds to a red shift of about 0.27 nm/K. This is due to the reduction of the band gap with increasing temperature. In range 2 between 20 and 60° C., this red shift is compensated to a small extent by a blue shift. This shift results from the increased charge carrier density Nth at the lasing threshold, as shown in FIG. 8. In range 3 between 80° C. and 120° C., the wavelength decreases to a small degree due to the blue shift of the gain. This is due to the increased charge carrier density Nth at the lasing threshold.

Curve (3) shows the wavelength of a semiconductor laser comprising a first resonator mirror 125 the reflectance of which behaves as explained in FIG. 7C. The emitted wavelength of this semiconductor laser increases only slightly within range 1 between −40° C. and 0° C., the increase corresponding to about 0.1 nm/K. This is due to the steep negative slope of the reflectance with wavelength in a low-wavelength range below 905 nm. In range 2 between 20 and 60° C., there is a reduced red shift due to the special reflectance of the mirror. In range 2, the maximum emission wavelength is already reached. From a temperature of 60° C. and within range 3 between 80 and 120° C., the wavelength decreases significantly due to the blue shift of the gain. This in turn is due to the increased charge carrier density Nth at the lasing threshold.

Curve (4) shows the wavelength of a semiconductor laser comprising a first resonator mirror 125 the reflectance of which behaves as explained in FIG. 7C. The emitted wavelength of this semiconductor laser initially increases within range 1 between −40° C. and 0° C., the increase corresponding to the red shift of around 0.27 nm/K. This, in turn, is due to the reduction of the band gap with increased temperature. In range 2 between 20 and 60° C., there is a reduced red shift of 0.067 nm/K due to the special reflectance of the first resonator mirror. Within range 3 between 80 and 120° C., the wavelength decreases due to the blue shift of the gain. This is due to the increased charge carrier density Nth at the lasing threshold.

Curve (5) shows the wavelength of a semiconductor laser comprising a first resonator mirror 125 the reflectance of which behaves as explained in FIG. 7C. The emitted wavelength of this semiconductor laser initially increases within range 1 between −40° C. and 0° C., the increase corresponding to the red shift of around 0.27 nm/K. This, in turn, is due to the reduction of the band gap with increased temperature.

In range 2 between 20 and 60° C., there is a reduced red shift of 0.067 nm/K due to the special reflectance of the first resonator mirror. Within range 3 between 80 and 120° C., the wavelength decreases due to the blue shift of the gain. This is due to the increased charge carrier density Nth at the lasing threshold.

Assuming that the semiconductor laser is to emit a stable wavelength within a temperature range from 0 to 60° C., it may be seen that the semiconductor laser comprising a first resonator mirror 125 having the reflectance according to curve (3), (4), or (5) as shown in FIG. 7C gives good results.

Figure 9B:
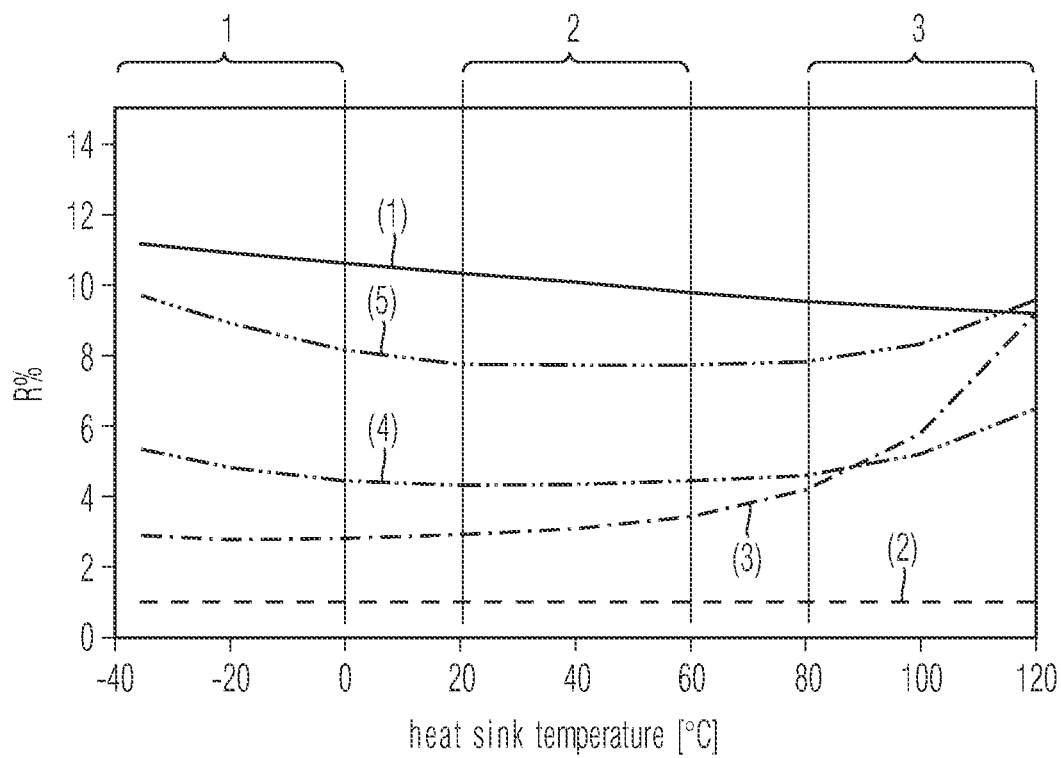
FIG. 9B illustrates the course of the reflectance with temperature for various semiconductor lasers according to embodiments.

FIG. 9B illustrates the reflectance of the first resonator mirror as a function of temperature. The reflectance was determined in respect of the first resonator mirror having the properties and layer structure discussed with reference to FIG. 7C. The reflectance represents the reflectance at the operating wavelength associated with the respective temperature.

As may be seen from curve (1), for the resonator mirror 125, the reflectance of which decreases linearly from 880 nm from 12% to about 7.2% at 960 nm, the reflectance increases slightly with decreasing temperature due to the red-shift of the gain.

Owing to the structure of the resonator mirror according to curve (2) (approximately constant reflectance with wavelength), its reflectance is also nearly independent of the temperature.

For the resonator mirrors according to curves (4) and (5), the reflectance drops within region 1 between −40 and 0° C. The wavelength approaches the respective base point of the resonator mirror. In range 2 between 20 and 60° C., the reflectance is constant. The wavelength changes analogously to the mirror red shift. Within region 3 between 80 and 120° C., the reflectance increases due to the blue shift caused by the high carrier density Nth at the lasing threshold.

For the resonator mirror according to curve (3), the reflectance within regions 1 and 2 is approximately constant. Here, the large negative slope $\Delta_3$ discussed with reference to FIG. 7C is visible. There is only a slight red shift.

Since the resonator mirrors according to curves (3) to (5) have a reflectance that increases within region 3 as a result of the blue shift, these resonator mirrors are suitable for achieving good optical efficiency data.

If low sensitivity to optical feedback is desired, the high reflectance of the resonator mirror according to curve (5) is favorable.

Figure 9C:
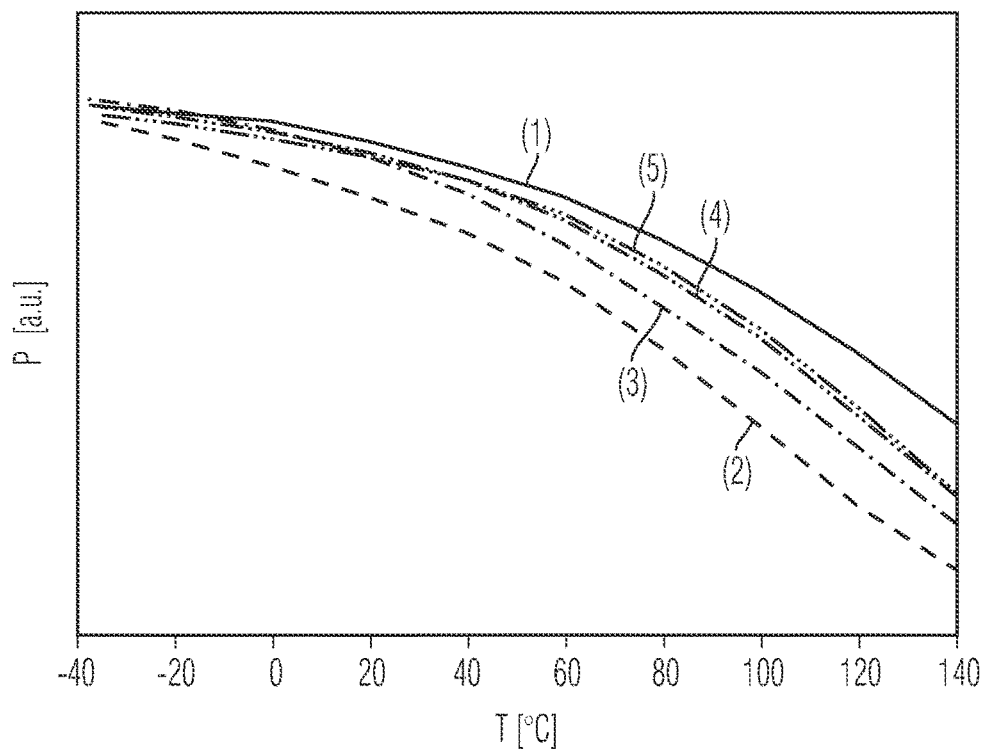
FIG. 9C illustrates the course of the power with temperature for various semiconductor lasers according to embodiments.

FIG. 9C illustrates the optical output power of the semiconductor laser comprising the various first resonator mirrors 125 as discussed with reference to FIG. 7C. The output powers were determined at 60° C. and uniform current.

As may be seen from the comparison, the optical output peak power when using the first resonator mirror according to curves (3) to (5) is somewhat reduced compared to the resonator mirror according to curve (1). It also becomes clear that the resonator mirror according to curve (2) having a constantly low reflectance has the lowest efficiency. It follows from this that the resonator mirrors according to curves (3) to (5) may effect wavelength stability of the semiconductor laser without any appreciable loss of efficiency.

Figure 9D:
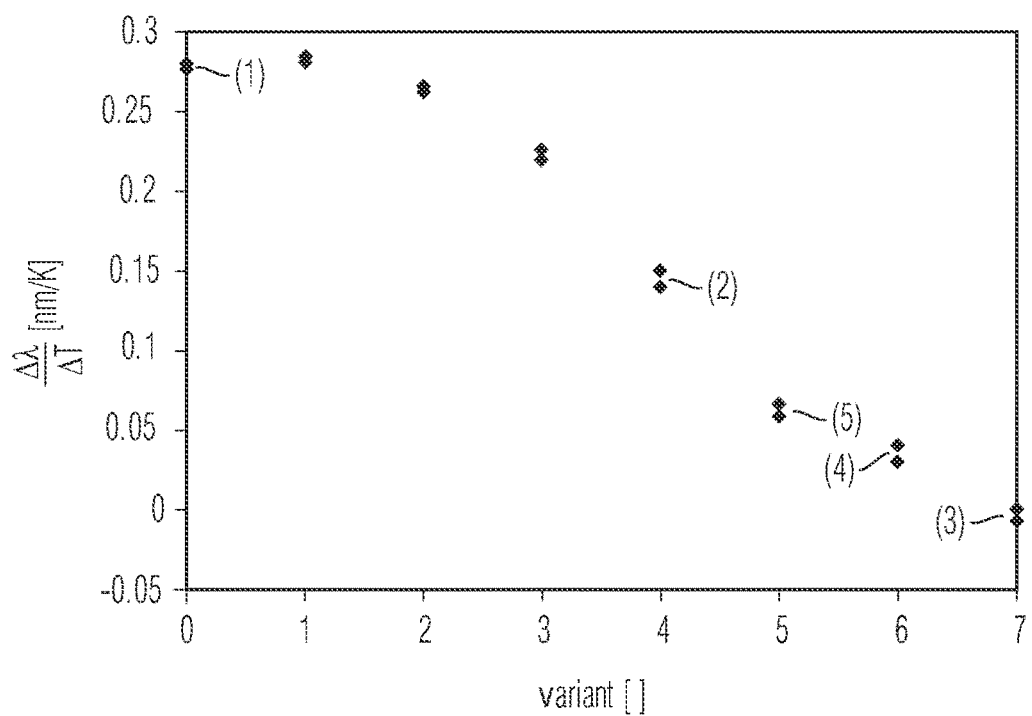
FIG. 9D depicts the differences between temperature responses of the emission wavelength of various semiconductor lasers.

FIG. 9D shows a plot of the emission wavelength change with temperature for semiconductor lasers comprising different first resonator mirrors 125. On the one hand, the first resonator mirrors 125 having the properties and layer structure discussed with reference to FIG. 7C were used. The emission wavelength change with temperature corresponds to the quotient of the difference in emission wavelengths at 25° C. and at 80° C. and the temperature at an output power of 10 W.

The resonator mirror according to variant zero is a resonator mirror the reflectance of which is shown in curve (1) in FIG. 7C. In addition, the resonator mirror according to variant 1 is a resonator mirror the reflectance of which is constantly at 7%. The resonator mirror according to variant 2 is a resonator mirror the reflectance of which is constantly at 5%, and the resonator mirror according to variant 3 is a resonator mirror the reflectance of which is constantly at 3%. lies. The resonator mirror according to variant four is a resonator mirror the reflectance of which is shown in curve (2) in FIG. 7C and is constantly at 1%. The resonator mirror according to variant five is a resonator mirror the reflectance of which is shown in curve (5) in FIG. 7C. The resonator mirror according to variant six is a resonator mirror the reflectance of which is shown in curve (4) in FIG. 7C. The resonator mirror according to variant seven is a resonator mirror the reflectance of which is shown in curve (3) in FIG. 7C.

As may be seen, the emission wavelength change with temperature is highest for variant 1 at around 0.27 nm/K and decreases to a value around 0 for variant 7. The emission wavelength change for variant 1 corresponds to the change in the band gap with temperature.

As has been described above, increased temperature stability of the emission wavelength may be achieved by using the first resonator mirror 125 having the properties shown. Accordingly, it is possible to implement the first resonator mirror using a special facet coating, which is a component of the edge-emitting semiconductor laser anyway. As a result, increased temperature stability may be achieved without affecting costs and effort.

Furthermore, by using the first resonator mirror having a sharply falling slope toward greater wavelengths, for example according to curves (3) to (5) as illustrated in FIG. 7C, the emission spectrum is compressed on the long-wavelength side. For example, in comparison to the emission spectrum of a laser having a reflectance of the first resonator mirror according to curve (1), the long-wave falling slope becomes steeper and the line width of the spectrum thus becomes smaller. For example, the emission bandwidth may be reduced by more than 15%. This effect is particularly pronounced at higher temperatures.

Figure 9E:
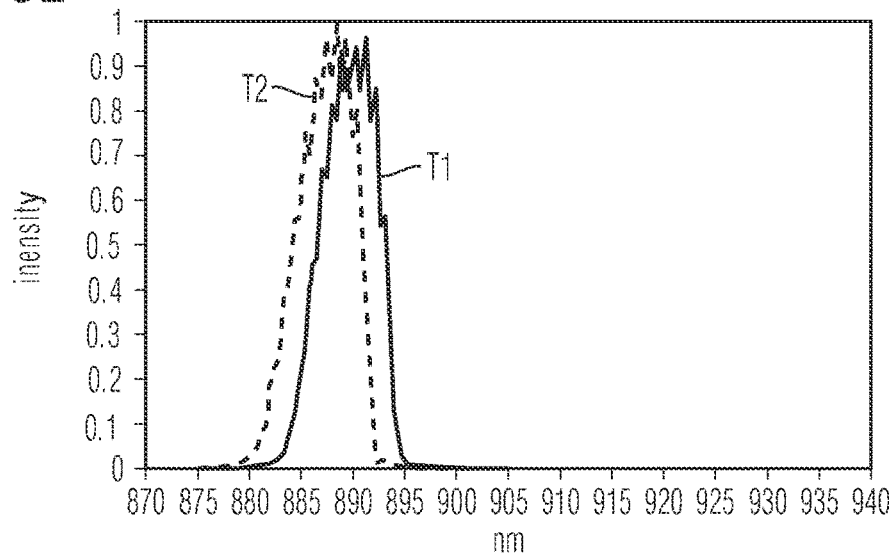
FIG. 9E depicts the emission intensity for various semiconductor lasers as a function of temperature.
Figure 9E:
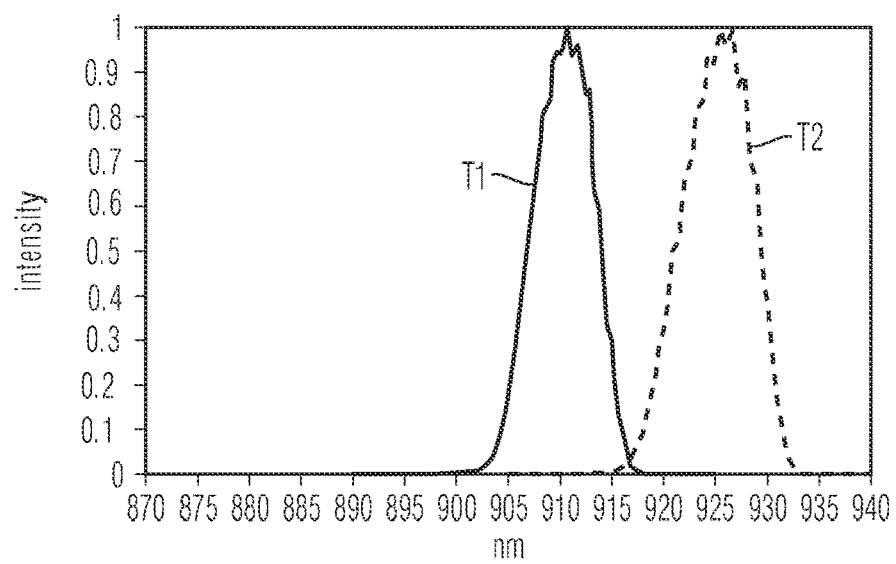

In FIG. 9E, the upper area shows the emission spectrum of a semiconductor laser comprising the first resonator mirror according to curve (3) in FIG. 7C at 20° C. (solid line) and at 85° C. (dashed line). For comparison, the lower part shows the emission spectrum of a semiconductor laser comprising the first resonator mirror according to curve (1) in FIG. 7C at 20° C. (solid line) and at 85° C. (dashed line). As may be seen, in the upper part of FIG. 9E, a slight wavelength shift of the spectrum (<5 nm) occurs toward lower wavelengths than in the lower region of FIG. 9E. Furthermore, the full width at half maximum (line width at an intensity of 0.5) is reduced by more than 15%. For example, the FWHM of the spectrum at 85° C. is 7 nm in the upper part and 8.5 nm in the lower part.

The reduced emission bandwidth may lead to further improved performance in some applications. For example, this semiconductor laser 10 may be used for optically pumping a solid-state laser. The pumping efficiency may be increased when pumping the narrow absorption line, for example of Nd:YAG or Yb:YAG fiber lasers. The reduced bandwidth of the emission of the sources may also be advantageous in LIDAR systems with sources, filters, and detectors.

As has been described, the mirror losses rise rapidly due to the edge shape of the cut-off filter when the temperature and thus the wavelength increases, and greatly increase the threshold carrier density, which in turn leads to a blue shift and to quasi self-adjusted compensation of the wavelength shift in an entire temperature range. Within this range, the effective reflectance remains nearly constant, and the emission wavelength practically follows the temperature-dependent spectral position of the reflectance of the first resonator mirror 125 (approx. 0.07 nm/K). As a result, the robustness and manufacturability of the semiconductor laser is greater than in approaches that depend on specific resonance conditions or the like. When using the laser diode, it is often required that the emission wavelength does not leave a specified corridor over a specified temperature range (for example 0 to 85° C. or −40° C. to 120° C.). The effect of overcompensation for the red shift, which is additionally made possible by the measures described, may even produce a blue shift at high temperatures if designed appropriately, which makes the usable temperature range of wavelength stabilization particularly large. The change in wavelength with temperature will be positive at low temperatures and negative at high temperatures, and the emission wavelength will have a maximum at medium temperatures. In addition to increasing the temperature range that may be used for wavelength stabilization, the reduction in wavelength at high temperatures leads to an increase in the reflectance of the first resonator mirror due to the low-pass-like shape of the reflectance as a function of wavelength. This in turn increases the efficiency of the laser, especially at high temperatures, compared to a laser showing a flat characteristic of reflectance of the first resonator mirror. Wavelength stabilization through adjustment of the reflectance of the first resonator mirror is achieved by modifying the facet of lower reflectance. As a result, it also works for semiconductor lasers with any number of laser elements $127_1$, $127_2$, . . . stacked on top of one another.

As has been described with reference to FIGS. 7A to 9E, the reflectance of the first resonator mirror 125 is wavelength-dependent and is less than 10% or less than 8% within a range of the target wavelength. The reflectance of the second resonator mirror 130 is more than 95%, for example. For example, according to embodiments, the reflectance of the second resonator mirror 130 is not wavelength-dependent or only to a small degree. In this way, outcoupling of usable optical output power at the second resonator mirror 130 is suppressed as far as possible. Furthermore, uncontrolled or harmful absorption of optical output power in the housing may be avoided.

According to embodiments, a length of the optical resonator 131 may be less than 1 mm, for example less than 700 µm. In this way, the mirror losses may be increased compared to the length of the resonator 131 in which amplification occurs.

According to embodiments, other features may be implemented to increase the effect of wavelength blue shift with increasing temperature. For example, additional features may cause a small differential gain to be achieved. Furthermore, features may be implemented in order to broaden the gain and thereby reduce the gain maximum.

For example, the active zone may comprise a multiple quantum well structure with quantum wells that are detuned to one another.

Figure 9F:
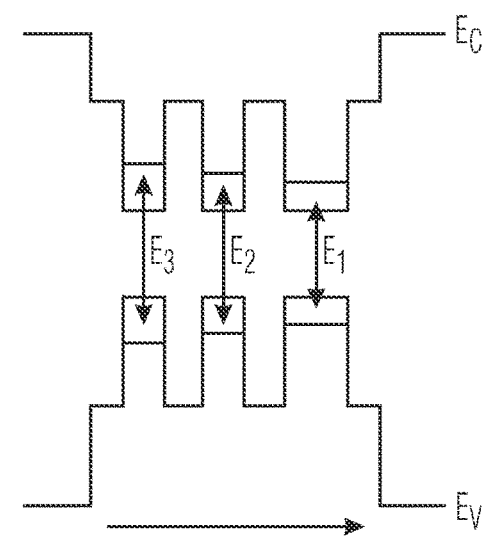
FIG. 9F shows a detail of an active zone.

FIG. 9F shows an example of a course of conduction and valence bands in the active zone of a semiconductor laser according to embodiments, for example in a horizontal direction perpendicular to the extension direction of the optical resonator 131. For example, three quantum wells are contained in the associated active zone. The composition and/or layer thickness of the individual layers is/are selected such that the energy differences between the respective energy levels in the conduction and valence bands differ slightly in each case. For example, transition energies E1, E2, E3 may be assigned to each of the quantum wells shown. The transition energies E1, E2, E3 are each slightly different. For example, the respectively emitted wavelength may differ by more than 5 nm, for example by more than 10 nm.

In this way, the wavelength-dependent gain may be broadened. Furthermore, the maximum gain may be reduced. As a result, the blue shift is increased. Accordingly, the temperature stability of the semiconductor laser may be further improved. Furthermore, manufacturing and yield of the semiconductor laser may be improved.

According to further embodiments, additional measures may be taken to increase the optical losses alpha_i. As a result, the charge carrier density Nth at the lasing threshold may be further increased.

Although the description of features of the semiconductor laser of FIGS. 7B to 9F is given with reference to the semiconductor laser shown in FIG. 7A, it is obvious that the features and concepts described are also applicable to the semiconductor laser which is shown, for example, in FIGS. 1B, 1C and 1D. Furthermore, the concepts described may also be applied to semiconductor lasers of a different material system.

Figure 10A:
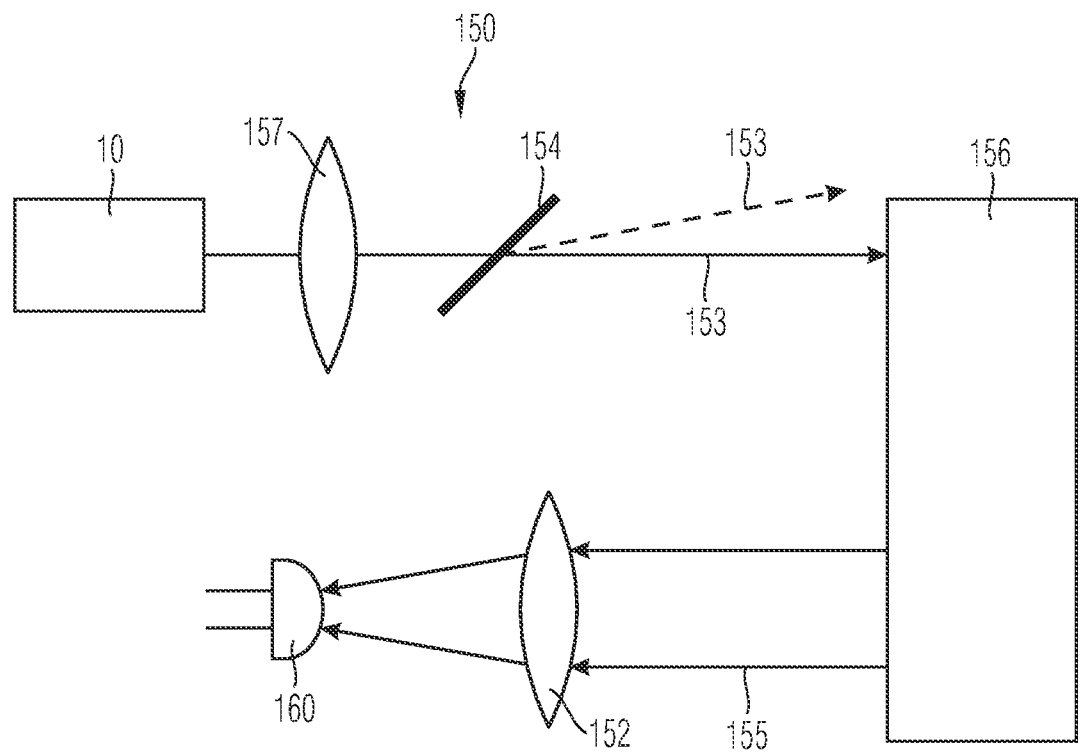
FIG. 10A depicts a LIDAR system according to embodiments.

FIG. 10A shows a schematic arrangement of a LIDAR system 150 in which the semiconductor laser 10 described may be used. The typically pulsed laser radiation emitted by the semiconductor laser 10 is transmitted, for example, by collimator optics 157 and a deflection/scanning unit 154. The object beam 153 is radiated onto an object 156 and reflected by it. This creates the reflected beam 155. The reflected beam 155 is fed to a detector 160 by receiving optics 152. The distance of the object 156 may be determined from the time difference between transmission of the laser pulse and reception of the laser pulse.

Since the semiconductor laser may be operated at a stable wavelength even at variable temperatures, it is possible to use a narrow-band detector. For example, the detector may use a narrow wavelength window of less than 10 nm, or less than 5 nm, or even less than 1 nm. As a result, the influence of solar radiation may be reduced and the signal-to-noise ratio may be increased. As a result, less power is required from the laser to measure the same distances, for example. As a result, the overall performance of the system is increased. Furthermore, the laser may be operated with less power for carrying out the same measurements at a constant signal-to-noise ratio. As a result, energy consumption is reduced. Furthermore, the semiconductor laser described may be manufactured in a simple manner.

Figure 10B:
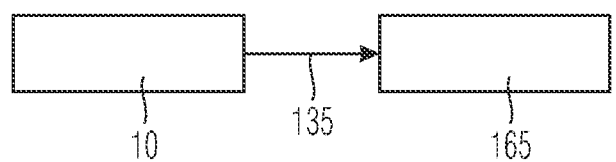
FIG. 10B illustrates a laser system according to embodiments.

FIG. 10B shows a laser system 164 comprising the semiconductor laser 10 as described above and a further laser 165, the further laser 165 being optically pumpable by the semiconductor laser 10. For example, the further laser 165 may be a solid-state laser or a fiber laser. For example, these lasers may have a very narrow absorption spectrum. Since the semiconductor laser 10 according to embodiments as described above is wavelength-stable over a wide temperature range, it may be used to optically pump lasers having a very narrow absorption spectrum.

According to further embodiments, the semiconductor laser described may also be used for laser welding or laser cutting.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. A semiconductor laser, comprising
a semiconductor layer stack, comprising an active zone for generating radiation,
a first resonator mirror, a second resonator mirror, and an optical resonator arranged between the first and second resonator mirrors which extends in a direction parallel to a main surface of the semiconductor layer stack, wherein a reflectance R1 of the first resonator mirror is wavelength-dependent, so that R1 or a combined reflectance corresponding to a product R of R1 and the reflectance R2 of the second resonator mirror decreases in a wavelength range from a target wavelength $\lambda_0$ of the laser to $\lambda_0+\Delta\lambda$ from a reflectance value R0, wherein $\Delta\lambda$ is selected as a function of a temperature-dependent shift in an emission wavelength and is less than 100 nm, and
wherein at least one of the following relationships applies to R:
(i) $R(\lambda)<0.3*R0$ for at least one wavelength $\lambda$ with $\lambda_0<\lambda<\lambda_0+\Delta\lambda$;
(ii) $dR/d\lambda<k$/nm for $\lambda=\lambda_0$ with a factor $k\leq-0.1\%$ or
at least one of the following relationships applies to R1:
(iii) $R1(\lambda)<0.3*R0$ for at least one wavelength $\lambda$ with $\lambda_0<\lambda<\lambda_0+\Delta\lambda$;
(iv) $dR1/d\lambda<k$/nm for $\lambda=\lambda_0$ with $k\leq-0.1\%$, and
wherein R or R1 increases with increasing wavelength to R0 at a wavelength less than $\lambda_0$.

2. The semiconductor laser according to claim 1, wherein the second resonator mirror has a wavelength-dependent reflectance, which increases to a local maximum value for wavelengths less than $\lambda_0$.

3. The semiconductor laser according to claim 1, wherein the following applies: $k\leq-0.2\%$.

4. The semiconductor laser according to claim 1, wherein at least one of the following relationships applies
(v) $dR/d\lambda<-g*R(\lambda)$/nm for $\lambda_0<\lambda<\lambda_0+\Delta\lambda$;
(vi) $dR1/d\lambda<-g*R1(\lambda)$/nm for $\lambda_0<\lambda<\lambda_0+\Delta\lambda$;
With a factor $g\geq0.03$.

5. The semiconductor laser according to claim 1, wherein a sum of intrinsic losses of the semiconductor laser and mirror losses caused by the first and second resonator mirrors increases for wavelengths $\lambda$ in a range of $\lambda_0<\lambda<\lambda_0+\Delta\lambda$.

6. The semiconductor laser according to claim 5, wherein the sum of the intrinsic losses of the semiconductor laser and the mirror losses caused by the first and second resonator mirrors for wavelengths $\lambda$ in the range of $\lambda_0<\lambda<\lambda_0+\Delta\lambda$ is at least half as steep as a curve that corresponds to the product of the confinement factor $\Gamma(\lambda, T)$ and the wavelength-dependent gain $g(\lambda,T)$.

7. The semiconductor laser according to claim 6, wherein the sum of the intrinsic losses of the semiconductor laser and the mirror losses caused by the first and second resonator mirrors for wavelengths $\lambda$ in the range of $\lambda_0<\lambda<\lambda_0+\Delta\lambda$ is steeper than a curve that corresponds to the product of the confinement factor $\Gamma'(2, T)$ and the wavelength-dependent gain $g(\lambda,T)$.

8. The semiconductor laser according to claim 1, wherein the first resonator mirror is implemented as a Bragg mirror.

9. The semiconductor laser according to claim 8, wherein the Bragg mirror comprises epitaxially grown semiconductor layers.

10. The semiconductor laser according to claim 9, wherein at least one of the semiconductor layers of the Bragg mirror is suitable for absorbent electromagnetic radiation having a wavelength range which is smaller than $\lambda_0$.

11. The semiconductor laser according to claim 1, wherein the reflectance R1 of the first resonator mirror or the combined reflectance R is less than 8% in a range of the target wavelength.

12. The semiconductor laser according to claim 1, wherein the active zone exclusively comprises a single quantum well structure.

13. The semiconductor laser according to claim 1, wherein the active zone comprises a multiple quantum well structure comprising quantum wells which are detuned to one another.

14. The semiconductor laser according to claim 1, wherein a charge carrier density at the lasing threshold increases by more than 25% in a temperature range from 0° to 60° C.

15. The semiconductor laser according to claim 1, the emission wavelength of which decreases with temperature at a temperature greater than 100° C.

16. The semiconductor laser according to claim 15, the emission wavelength of which decreases with temperature at a temperature greater than 60° C.

17. The semiconductor laser according to claim 1, wherein the semiconductor layer stack comprises a plurality of laser elements which are arranged one above the other and are connected to one another through connecting layers.

18. The semiconductor laser according to claim 1, wherein the lateral boundaries of the semiconductor layer stack are beveled, so that emission of generated electromagnetic radiation is accomplished through a first main surface of the semiconductor layer stack.

19. A LIDAR system, comprising the semiconductor laser according to claim 1.

20. A laser system, comprising the semiconductor laser according to claim 1 and a further laser, the further laser being optically pumpable by the semiconductor laser.

* * * * *

UNITED STATES PATENT AND TRADEMARK OFFICE
CERTIFICATE OF CORRECTION

PATENT NO. : 12,374,860 B2  
APPLICATION NO. : 17/919843  
DATED : July 29, 2025  
INVENTOR(S) : Peter Fuchs et al.

Page 1 of 1

It is certified that error appears in the above-identified patent and that said Letters Patent is hereby corrected as shown below:

In the Claims

Column 28, Line 10, Claim 7, "Γ′ (2, T)" should be --Γ(λ, T)--.

Signed and Sealed this  
Second Day of September, 2025

Coke Morgan Stewart  
*Acting Director of the United States Patent and Trademark Office*